US012581876B2

(12) United States Patent
Fan et al.

(10) Patent No.: US 12,581,876 B2
(45) Date of Patent: Mar. 17, 2026

(54) SEMICONDUCTOR DEVICE INCLUDING WORK FUNCTION LAYER DOPED WITH BARRIER ELEMENTS AND METHOD FOR FORMING THE SAME

(71) Applicant: TAIWAN SEMICONDUCTOR MANUFACTURING COMPANY LTD., Hsinchu (TW)

(72) Inventors: Chia Chan Fan, Taichung City (TW); Chung-Liang Cheng, Changhua County (TW); Chin-Chia Yeh, Taichung City (TW); Chieh Chiang, Taichung City (TW); Cheng Yu Pai, Taichung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 651 days.

(21) Appl. No.: 17/823,970

(22) Filed: Sep. 1, 2022

(65) Prior Publication Data

US 2024/0079229 A1 Mar. 7, 2024

(51) Int. Cl.
H01L 21/02 (2006.01)
H01L 21/311 (2006.01)
(Continued)

(52) U.S. Cl.
CPC .. H01L 21/02304 (2013.01); H01L 21/02205 (2013.01); H01L 21/0223 (2013.01);
(Continued)

(58) Field of Classification Search
CPC ......... H01L 21/02304; H01L 21/02205; H01L 21/0223; H01L 21/0228; H01L 21/31116; H01L 21/3215; H01L 21/02183; H01L 21/02194; H01L 21/02362; H01L 21/02186; H10D 64/01; H10D 64/667; H10D 64/685; H10D 64/691
See application file for complete search history.

(56) References Cited

U.S. PATENT DOCUMENTS

| | | | |
|---|---|---|---|
| 2017/0009346 A1* | 1/2017 | Kumar | C23C 16/45542 |
| 2018/0218912 A1* | 8/2018 | Tsai | H10D 30/024 |
| 2021/0273070 A1* | 9/2021 | Lee | H10D 84/0172 |

FOREIGN PATENT DOCUMENTS

| | | | | |
|---|---|---|---|---|
| CN | 113053821 A | * | 6/2021 | ....... H01L 21/28097 |

* cited by examiner

*Primary Examiner* — Brian Turner
*Assistant Examiner* — Zhijun Xu
(74) *Attorney, Agent, or Firm* — WPAT LAW; Anthony King

(57) ABSTRACT

The present disclosure provides a method of manufacturing a semiconductor device. The method includes: forming a transistor region in a substrate; forming a gate dielectric layer over the transistor region; forming a diffusion-blocking layer over the gate dielectric layer; forming a first portion of a work function layer over the diffusion-blocking layer; forming a second portion of the work function layer over the first portion of the work function layer; forming a plurality of barrier elements on or under a top surface of the second portion of the work function layer; and forming a gate electrode over the work function layer, wherein the plurality of barrier elements block oxygen from diffusing into the work function layer during the formation of the gate electrode.

20 Claims, 32 Drawing Sheets

(51) Int. Cl.
    *H01L 21/3215*     (2006.01)
    *H10D 64/01*     (2025.01)

(52) U.S. Cl.
    CPC .... *H01L 21/0228* (2013.01); *H01L 21/31116*
        (2013.01); *H01L 21/3215* (2013.01); *H10D*
                       *64/01* (2025.01)

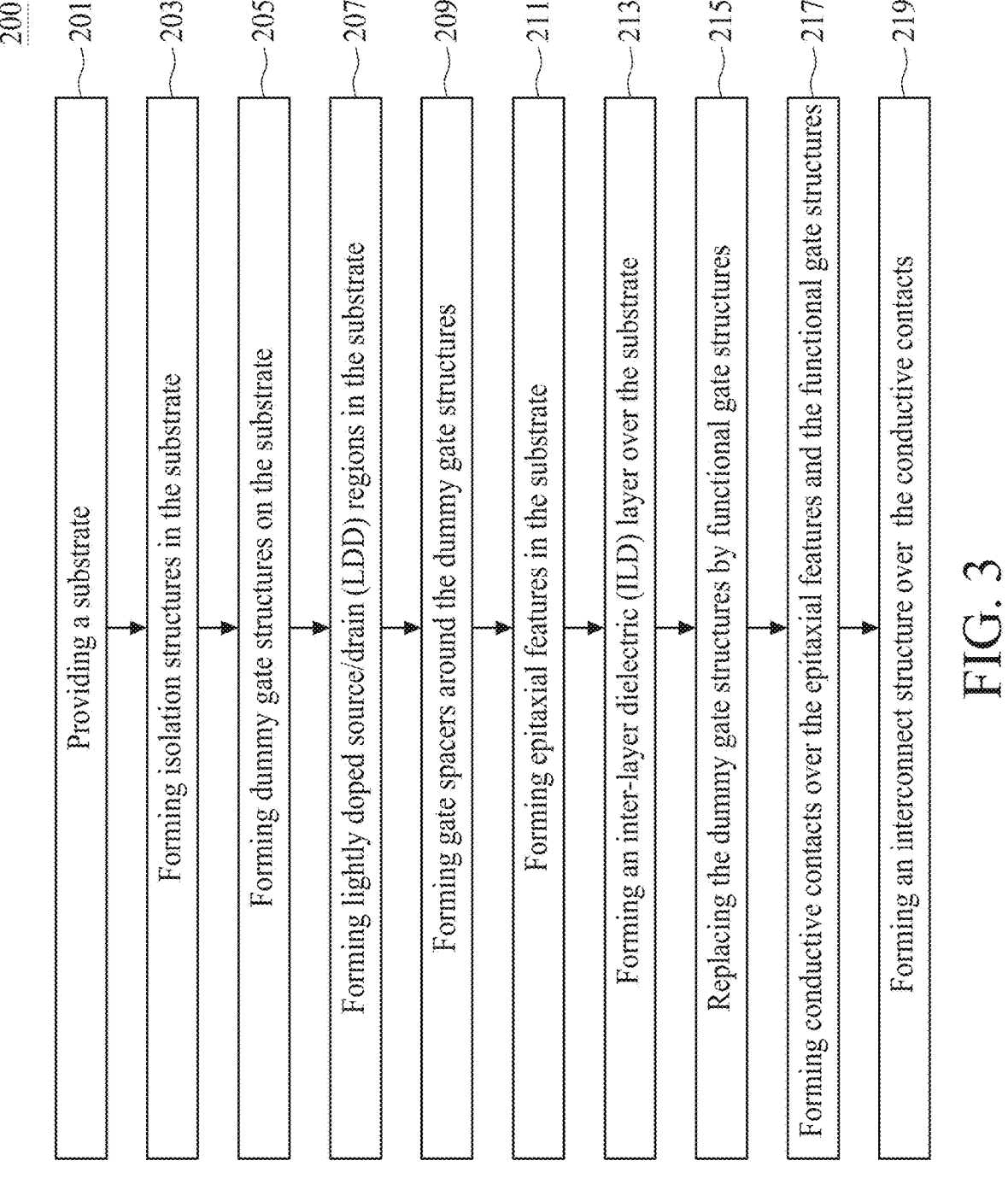

Providing a substrate — 201

Forming isolation structures in the substrate — 203

Forming dummy gate structures on the substrate — 205

Forming lightly doped source/drain (LDD) regions in the substrate — 207

Forming gate spacers around the dummy gate structures — 209

Forming epitaxial features in the substrate — 211

Forming an inter-layer dielectric (ILD) layer over the substrate — 213

Replacing the dummy gate structures by functional gate structures — 215

Forming conductive contacts over the epitaxial features and the functional gate structures — 217

Forming an interconnect structure over the conductive contacts — 219

SEMICONDUCTOR DEVICE INCLUDING WORK FUNCTION LAYER DOPED WITH BARRIER ELEMENTS AND METHOD FOR FORMING THE SAME

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. The MOSFET processes include a "gate last" technique to replace an original poly-silicon gate electrode with the metal gate electrode to improve device performance.

However, there are challenges to implement such features and processes in complementary metal-oxide-semiconductor (CMOS) fabrication. As the gate length and spacing between devices decrease, these problems are exacerbated. For example, it is difficult to prevent parasitic capacitance resulted among gate stacks of the MOSFET because of the reduced spacing between the gate stacks, thereby affecting the device performance.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

FIG. 3 is a flow diagram showing a method of fabricating a semiconductor device, in accordance with some embodiments of the present disclosure.

DETAILED DESCRIPTION

Figure 1:
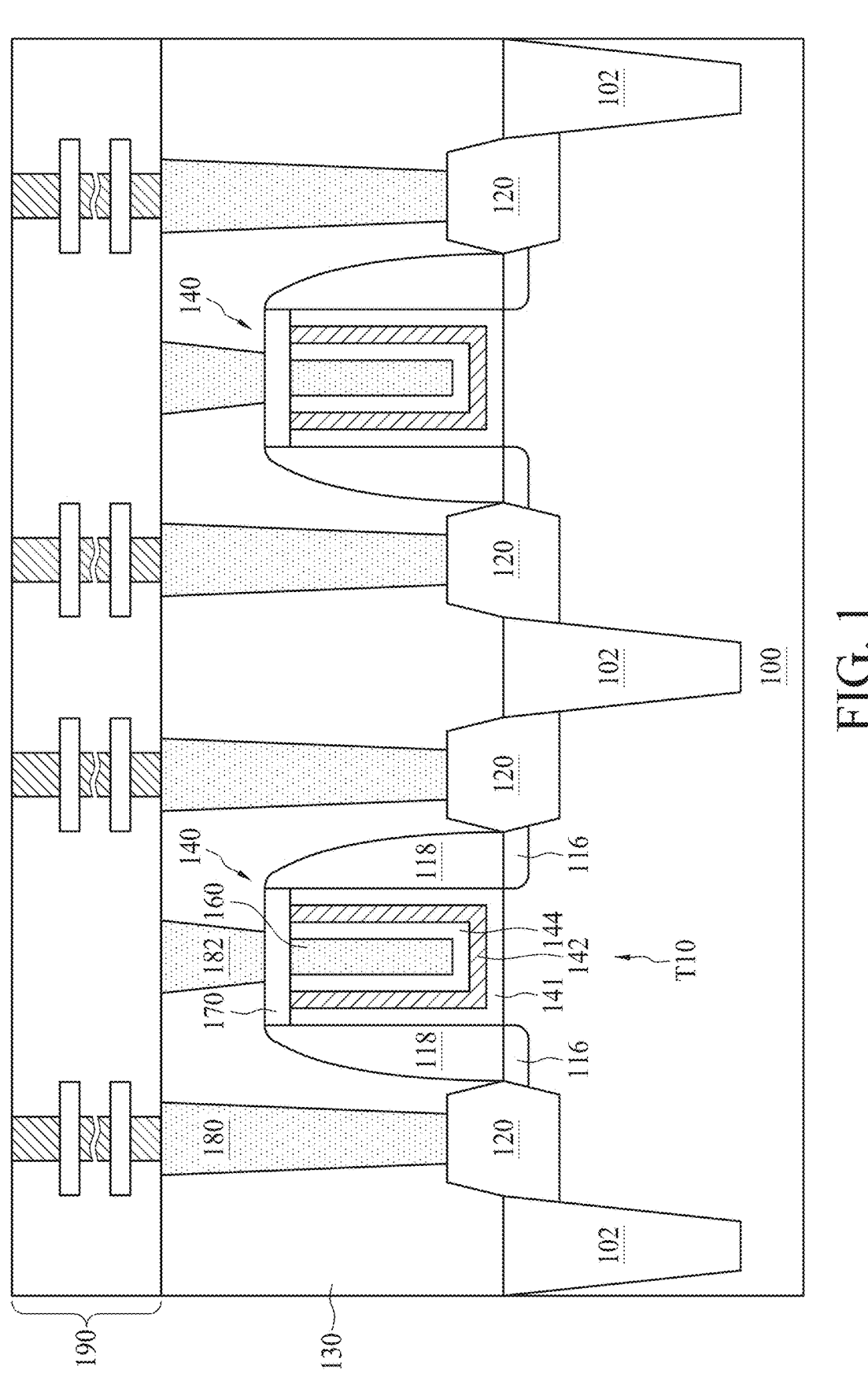
FIG. 1 is a schematic cross-sectional view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic cross-sectional view of a semiconductor device 10. The semiconductor device 10 includes multiple transistors T10 disposed on a substrate 100. The transistors T10 are separated by isolation structures 102 in the substrate 100. Each transistor T10 includes a functional gate structure 140 serving as a gate terminal and its corresponding epitaxial features 120 serving as source/drain terminals. The functional gate structure 140 includes a gate dielectric layer 141, a diffusion-blocking layer 142, a work function layer 144, a conductive layer 160 and/or a cap layer 170. The gate dielectric layer 141 is surrounded by a lightly doped source/drain (LDD) region 116 in the substrate 100. The diffusion-blocking layer 142 is conformally disposed on the gate dielectric layer 141. The work function layer 144 is conformally disposed on the diffusion-blocking layer 142. The conductive layer 160 is conformally disposed on the work function layer 144. The conductive layer 160 functions a gate electrode of the functional gate structure 140. A cap layer 170 is optionally disposed on the gate dielectric layer 141, the diffusion-blocking layer 142, the work function layer 144 and the conductive layer 160. The functional gate structure 140 is surrounded by a gate spacer 118 on the substrate 100. The gate spacer 118 at least covers portions of the LDD region 116.

An inter-layer dielectric (ILD) layer 130 is disposed over the substrate 100. The ILD layer 130 covers portions of the isolation structures 102, the epitaxial features 120, the gate spacers 118 and the functional gate structures 140. Conductive contacts 180 and 182 are disposed in the ILD layer 130. Each of the conductive contacts 180 is disposed on each of the epitaxial features 120, and each of the conductive contacts 182 is disposed on each of the functional gate structures 140. The conductive contact 180 is electrically coupled to the epitaxial feature 120, and the conductive contact 182 is electrically coupled to the functional gate structure 140. An interconnect structure 190 is disposed over the conductive contacts 180 and 182. The interconnect structure 190 includes multiple higher-level conductive features such as conductive vias and conductive lines embedded in one or more ILD layers or one or more inter-metal dielectric (IMD) layers. The interconnect structure 190 is electrically coupled to the conductive contacts 180, 182, the epitaxial features 120 and the functional gate structures 140.

Figure 2:
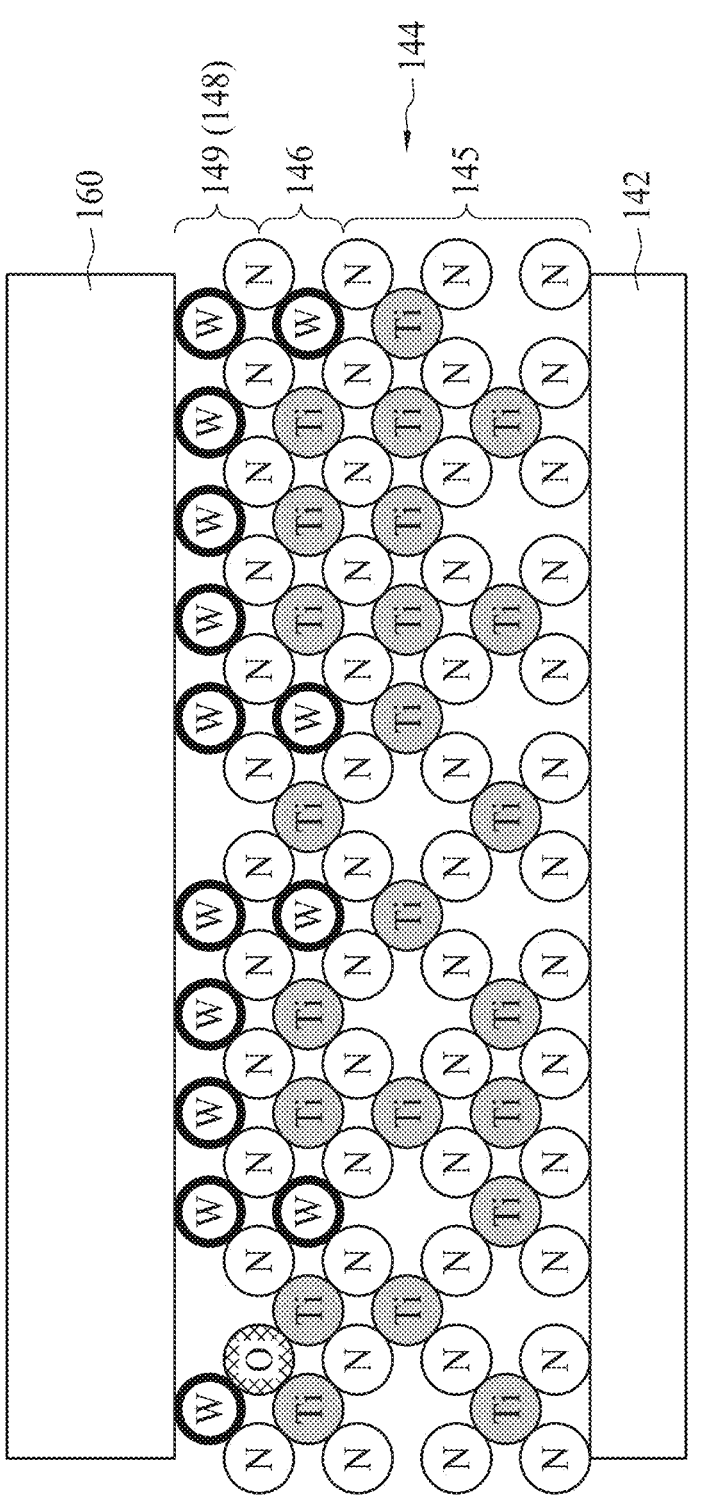
FIG. 2 is an enlarged view of a work function layer in FIG. 1, in accordance with some embodiments of the present disclosure.

FIG. 2 is an enlarged view of the work function layer 144 in FIG. 1. The work function layer 144 is between the diffusion-blocking layer 142 and the conductive layer 160. The work function layer 144 includes a first portion 145 disposed on a top surface of the diffusion-blocking layer 142 and a second portion 146 disposed on the first portion 145. A metal layer 148 or 149 is disposed between the second portion 146 of the work function layer 144 and the conductive layer 160. The metal layer 148 or 149 includes tungsten (W), molybdenum (Mo) or niobium (Nb). An interface is between the metal layer 148 or 149 and the conductive layer 160 since the conductive materials of the metal layer 148 or 149 and the conductive layer 160 are formed at different time and may be different.

FIG. 3 is a flow diagram showing a method 200 of fabricating the semiconductor device 10 in FIG. 1. FIGS. 4 to 25 are schematic cross-sectional views illustrating sequential operations of the method 200 shown in FIG. 3. The method 200 includes a number of operations (201, 203, 205, 207, 209, 211, 213, 215, 217 and 219) and the description and illustration are not deemed as a limitation to the sequence of the operations. A substrate is provided in operation 201. Isolation structures are formed in the substrate in operation 203. Dummy gate structures are formed on the substrate in operation 205. LDD regions are formed in the substrate in operation 207. Gate spacers are formed around the dummy gate structures in operation 209. Epitaxial features are formed in the substrate in operation 211. An ILD layer is formed over the substrate in operation 213. The dummy gate structures are replaced by functional gate structures in operation 215. Conductive contacts are formed over the epitaxial features and the functional gate structures in operation 217. An interconnect structure is formed over the conductive contacts in operation 219.

Figure 4:
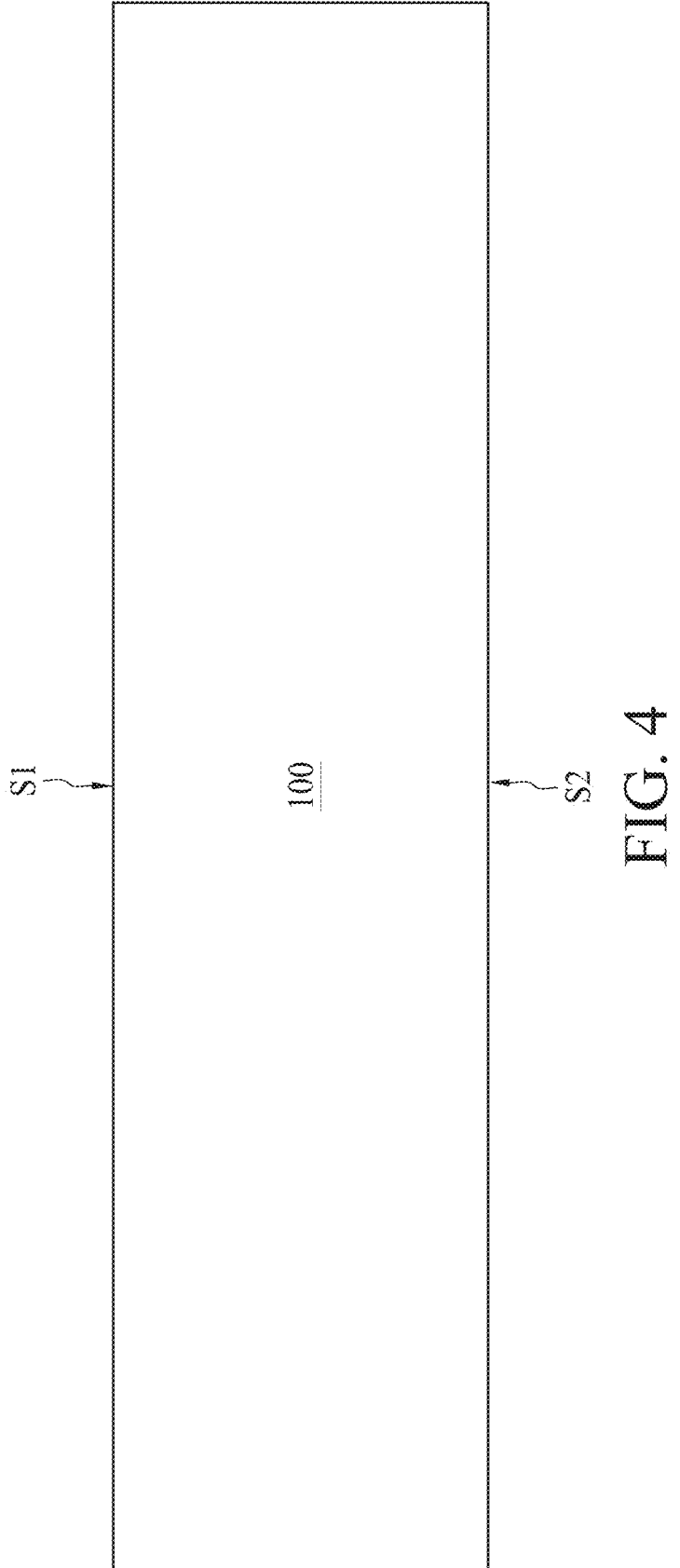
FIGS. 4 to 25 are schematic cross-sectional views illustrating sequential operations of the method shown in FIG. 3, in accordance with some embodiments of the present disclosure.

In operation 201 of FIG. 3, a substrate 100 is provided, as shown in FIG. 4. The substrate 100 may be a semiconductor substrate such as a bulk silicon wafer. In some embodiments, the substrate 100 is a semiconductor-on-insulator (SOI) substrate, a multi-layered or gradient substrate, or the like. The substrate 100 may include a semiconductor material such as Si, Ge, a compound or alloy semiconductor including SiC, SiGe, GaAs, GaP, GaAsP, AlInAs, AlGaAs, GaInAs, InAs, GaInP, InP, InSb, GaInAsP, or a combination thereof. The substrate 100 may be doped or undoped. The substrate has a top surface S1 and a back surface S2 opposite to the top surface S1. In some embodiments, the top surface S1 of the substrate 100 is an active side. In some embodiments, the back surface S2 of the substrate 100 is an active side.

Figure 5:
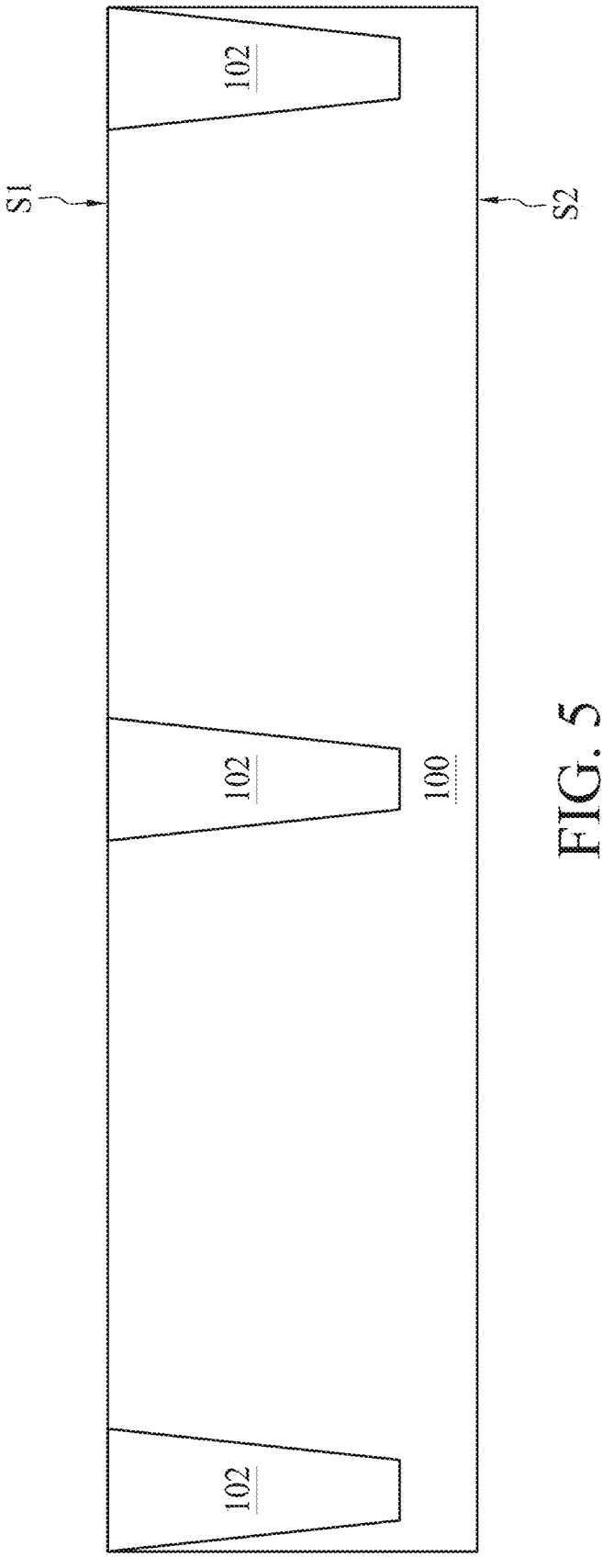

In operation 203 of FIG. 3, isolation structures 102 are formed in the substrate 100, as shown in FIG. 5. The isolation structures 102 may be shallow trench isolation (STI) regions. In some embodiments, the formation of the isolation structures 102 includes forming trenches in the substrate 100 by any acceptable etching operation, such as reactive ion etching (RIE), dry etching, or a combination thereof. The etching operation may be anisotropic. An insulating material is deposited to fill the trenches. The insulating material may be silicon oxide, silicon nitride, or a combination thereof. The insulating material may be deposited using chemical vapor deposition (CVD), atmospheric pressure CVD (APCVD), high density plasma CVD (HDP-CVD), or another suitable method. A planarization operation, such as a chemical mechanical polishing (CMP) operation, may be used to remove any excess insulating material over the top surface Si of the substrate 100 such that top surfaces of the isolation structures 102 and the top surface S1 are coplanar.

Although not specifically illustrated, appropriate wells may be formed in the substrate 100. In some embodiments, the isolation structures 102 are used to define one or more transistor regions in or over the substrate 100. In some embodiments, a P-well is formed in the substrate 100 where an N-type device, such as an N-type FET, is to be formed. In some embodiments, an N-well is formed in the substrate 100 where a P-type device, such as a P-type FET, is to be formed. In some embodiments, both a P-well and an N-well are formed in the substrate 100. The wells may be formed using an ion-implantation operation. P-type dopants such as boron (B), gallium (Ga) and indium (In), or N-type dopants such as phosphorous (P) and arsenide (As), may be implanted into selected regions of the substrate 100 using an implant mask.

Figure 6:
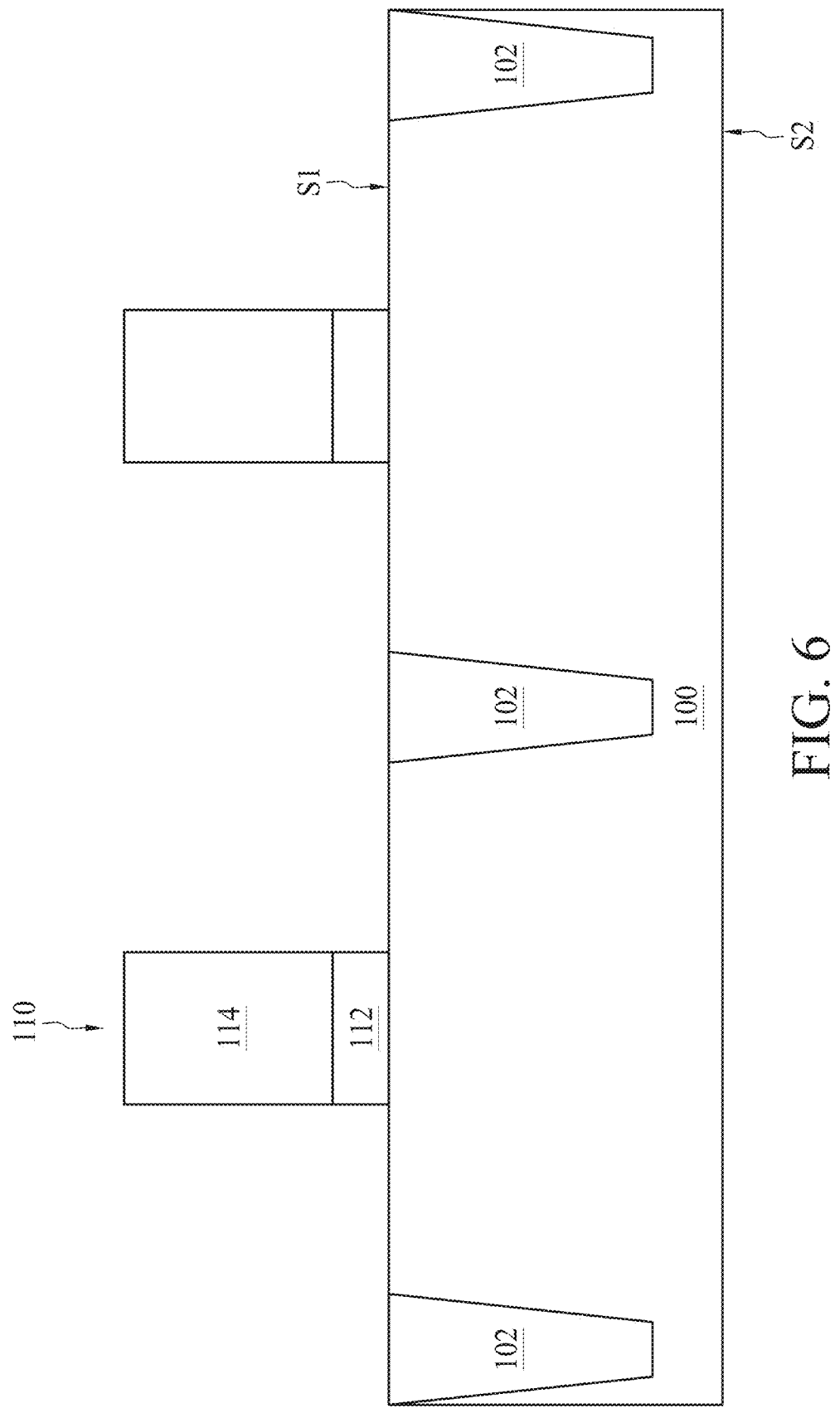

In operation 205 of FIG. 3, dummy gate structures 110 are formed on the substrate 100, as shown in FIG. 6. Each dummy gate structure 110 includes a dummy gate dielectric 112 and a dummy gate 114 disposed on the dummy gate dielectric 112. In some embodiments, the formation of the dummy gate structure 110 includes depositing or thermally growing a dielectric layer such as silicon oxide, silicon nitride, or a combination thereof on the substrate 100 using suitable operations, such as CVD, thermal oxidation or other suitable methods. A polysilicon layer is then formed over the dielectric layer using CVD or another suitable method. A patterned photoresist layer or a patterned nitride hardmask layer is formed on the polysilicon layer. An etching operation is performed on the polysilicon layer and the dielectric layer using the patterned photoresist layer or the nitride hardmask layer as an etching mask. The pattern of the etching mask may be respectively transferred to the polysilicon layer and the dielectric layer to form the dummy gate 114 and the dummy gate dielectric 112. The etching operation may include RIE, dry etching or other suitable methods.

Figure 7:
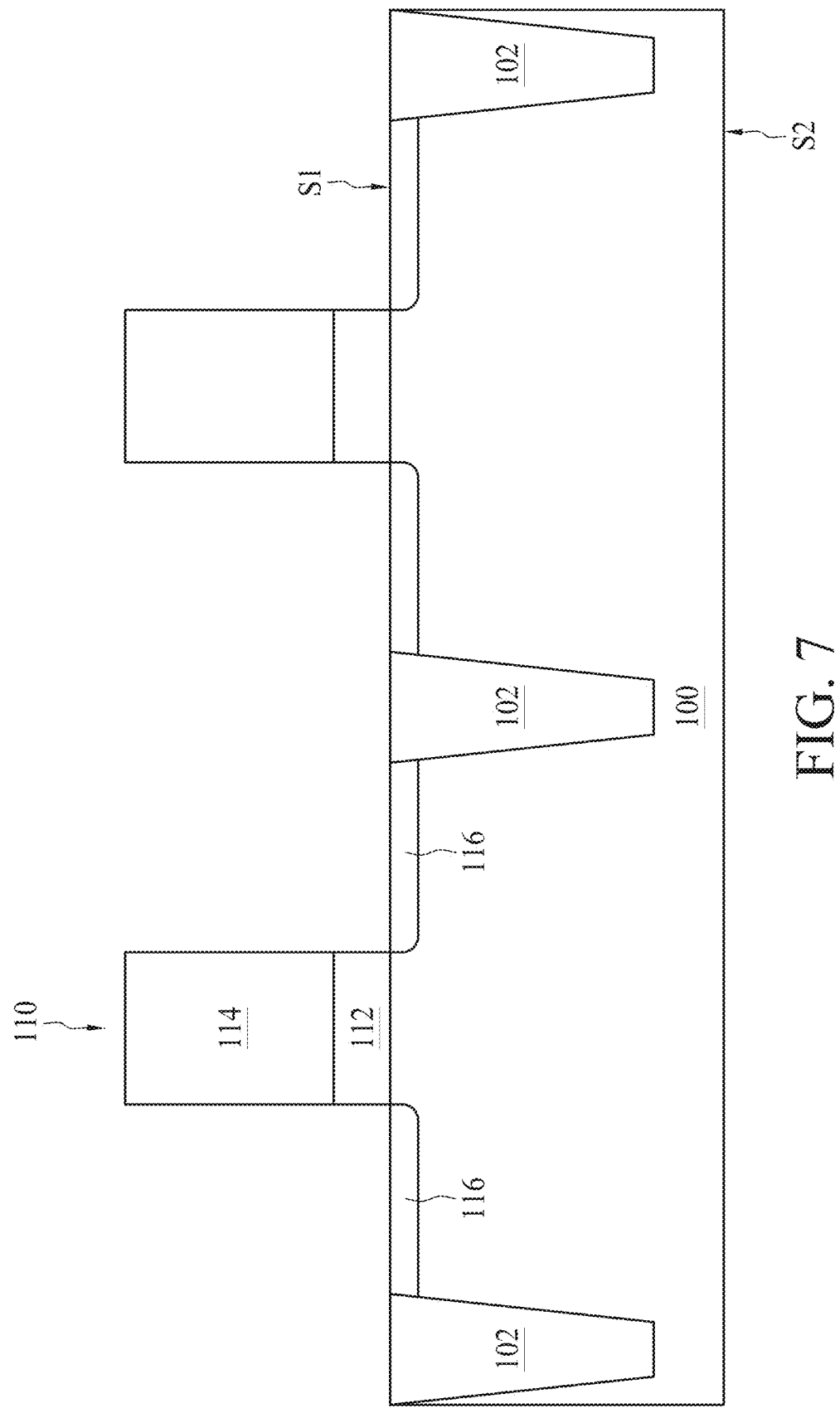

In operation 207 of FIG. 3, lightly doped source/drain (LDD) regions 116 are formed in the substrate 100, as shown in FIG. 7. An implant mask may be formed to cover the isolation structures 102 and the dummy gate structures 110, followed by an ion-implantation operation to form the LDD regions 116. For forming a P-type device, P-type dopants may be implanted into selected regions of the substrate 100 exposed by the implant mask. The LDD regions 116 may thus be P-type doped regions. For forming an N-type device, N-type dopants may be implanted into selected regions of the substrate 100 exposed by the implant mask. The LDD regions 116 may thus be N-type doped regions. The implant mask is then removed. An annealing operation, such as a rapid thermal annealing (RTA) operation, can be used to activate the implanted dopants.

Figure 8:
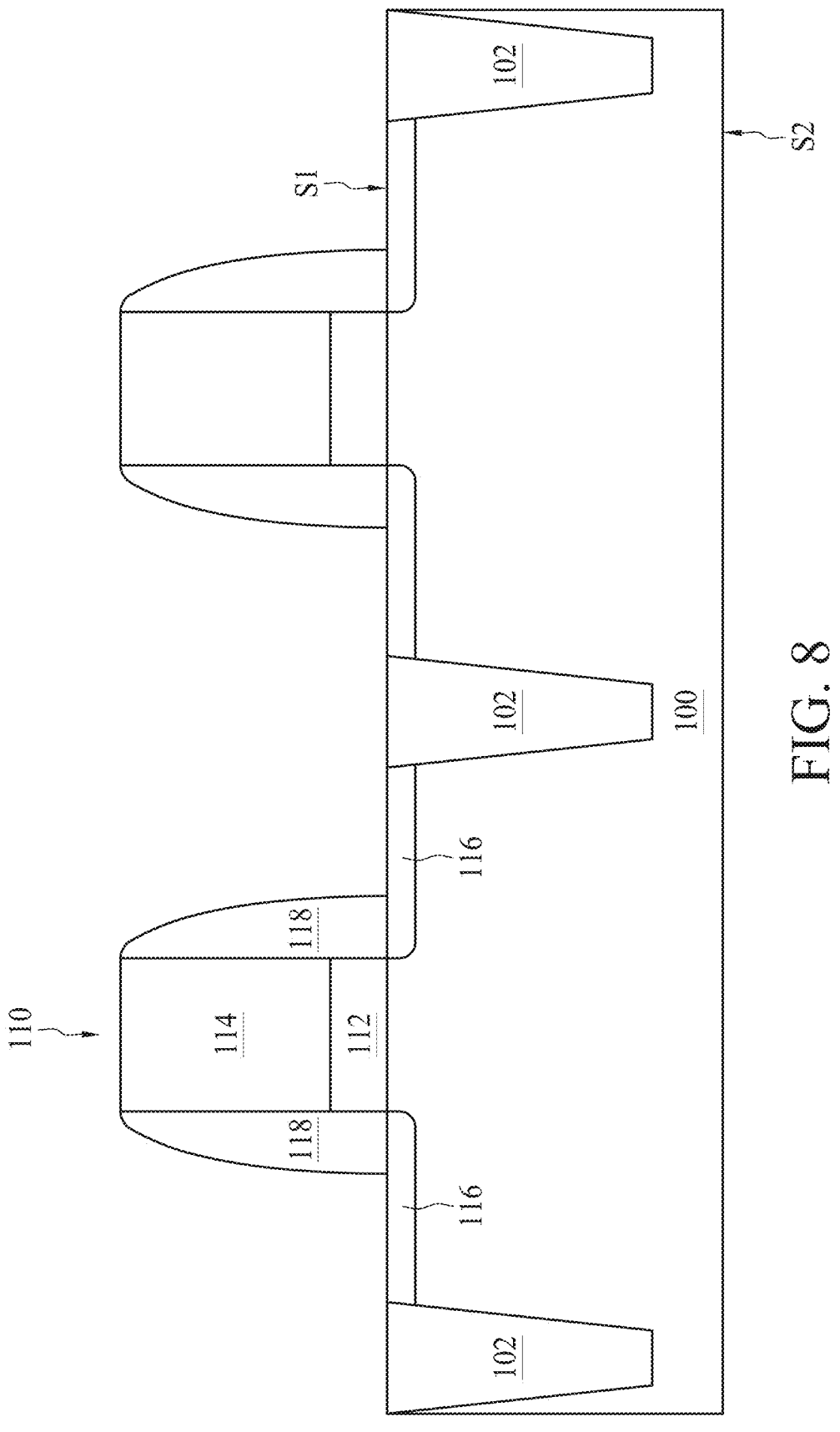

In operation 209 of FIG. 3, gate spacers 118 are formed around the dummy gate structures 110, respectively, as shown in FIG. 8. In some embodiments, the formation of the gate spacers 118 includes conformally forming a dielectric material on the substrate 100 and the dummy gate structures 110 using CVD or the like. The dielectric material may be silicon nitride, silicon carbon nitride, a combination thereof, or the like. An anisotropic etching operation is used to remove portions of the dielectric material and leave the dielectric material on sidewalls of the dummy gates 114 and the dummy gate dielectrics 112. The remaining dielectric material may form the gate spacers 118, and each gate spacer 118 surrounds a dummy gate structure 110.

Figure 9:
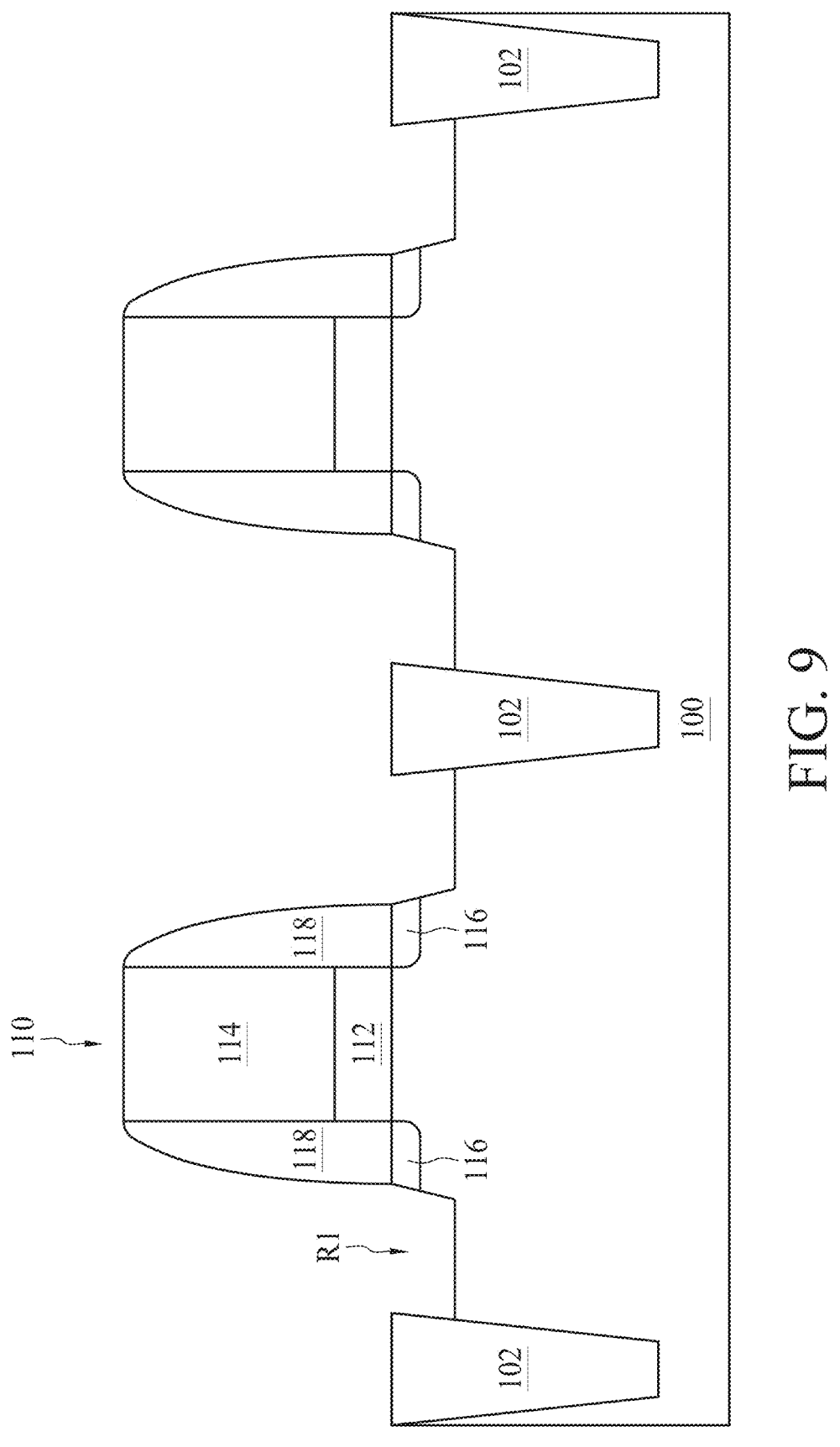
Figure 10:
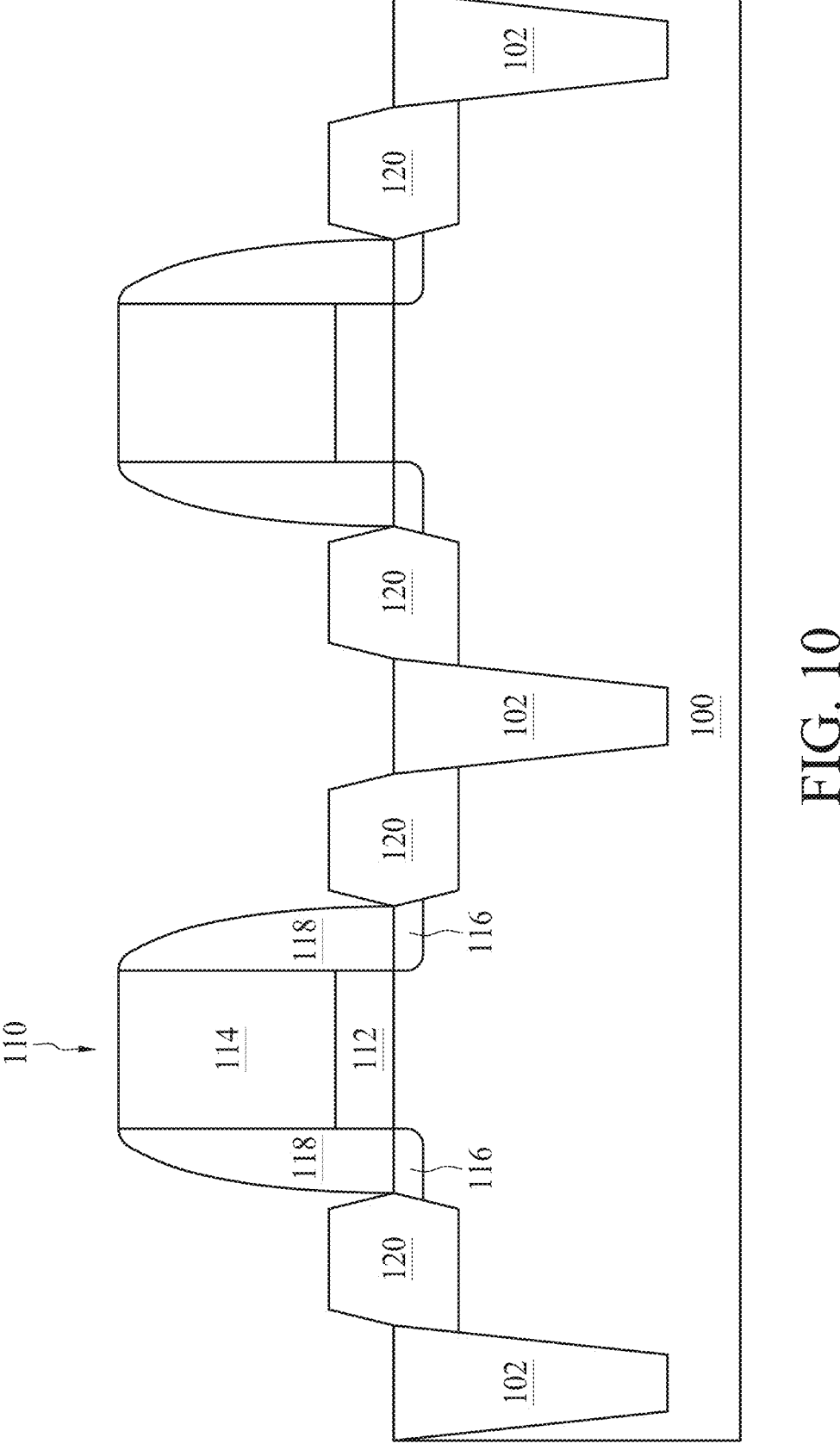

In operation 211 of FIG. 3, epitaxial features 120 are formed in the substrate 100, as shown in FIGS. 9 and 10. Referring to FIG. 9, in some embodiments, the formation of the epitaxial features 120 includes etching of portions of the substrate 100 between the isolation structures 102 and the gate spacers 118 to form multiple recesses R1. A formation method of the recesses R1 may include at least a lithographic operation and an etching operation. A patterned photoresist layer (not shown) may be used as an etching mask when performing the etching operation. In some embodiments, the gate spacers 118 also function as an etching mask. The etching operation may include an acceptable anisotropic or isotropic etching method, such as RIE, dry etching, wet etching or other suitable methods. A profile of the recesses R1 may be substantially triangular, trapezoidal, pentagonal, or hexagonal, depending on etching parameters of the etching operation. Subsequently, the etching mask may be removed using an etchant selective to the material of the etching mask.

Referring to FIG. 10, one epitaxial feature 120 is grown in each of the recesses R1 using an epitaxial growth operation. The epitaxial growth operation may include metal-organic chemical vapor deposition (MOCVD), selective epitaxial growth (SEG), molecular-beam epitaxy (MBE), vapor-phase epitaxy (VPE), liquid-phase epitaxy (LPE), and/or other suitable methods. In some embodiments, the epitaxial growth operation uses gaseous and/or liquid precursors, which interact with a composition of the substrate 100. The formation of the epitaxial features 120 may include doping with N-type or P-type dopants, which cause the epitaxial features 120 to be conductive. In some embodiments, the epitaxial features 120 are doped in-situ during the epitaxial growth operation. In some other embodiments, the epitaxial features 120 are undoped during the epitaxial growth operation, and are doped in a subsequent operation. The epitaxial features 120 may be exposed to an RTA operation, to diffuse the dopants in the epitaxial features 120.

Still referring to FIG. 10, each dummy gate structure 110 is between two epitaxial features 120. In some embodiments, the two epitaxial features 120 on either side of the dummy gate structure 110 may function as source/drain regions of a transistor formed in subsequent operations. In some embodiments, a silicide layer (not shown), such as cobalt-silicide (CoSi), nickel silicide (NiSi) or tungsten silicide (WSi), may be formed on a top surface of each epitaxial feature 120. The silicide layer may be used to increase compatibility between a material of the epitaxial feature 120 and a material of a conductive contact subsequently formed on the epitaxial feature 120. In addition, the silicide layer can reduce parasitic resistance or sheet resistance at a silicon/metal contact junction.

Although not illustrated, an etch-stop layer (not shown) can be formed on the isolation structures 102, the epitaxial features 120, the dummy gate structures 110 and the gate spacers 118. The etch-stop layer may be formed by conformally depositing a dielectric material onto the substrate 100 using atomic layer deposition (ALD), CVD and/or other suitable methods. The dielectric material of the etch-stop layer may include silicon oxide, silicon nitride, silicon carbon nitride, silicon oxynitride, silicon carbide, silicon oxycarbide, or other suitable materials.

Figure 11A:
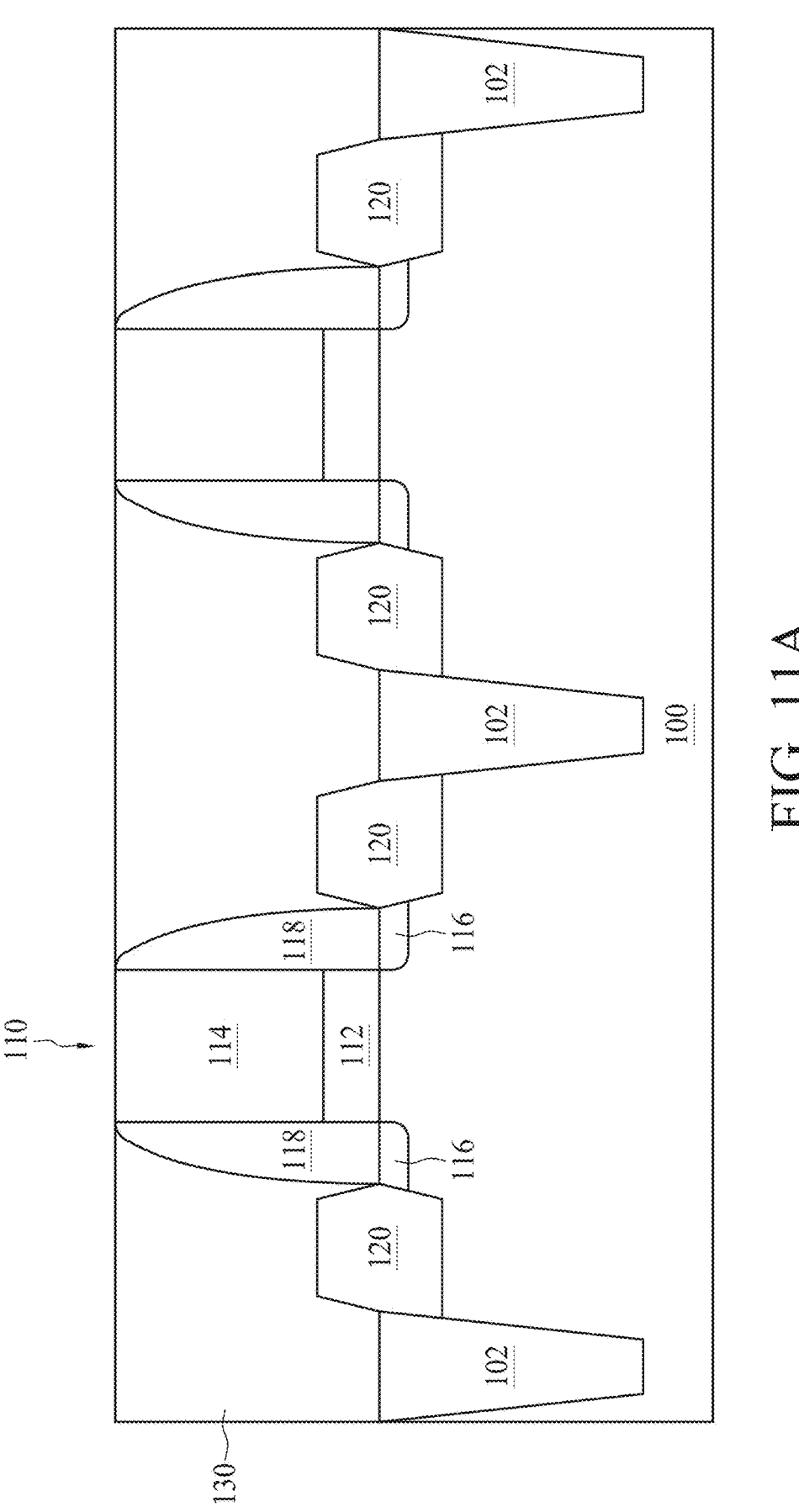
Figure 11B:
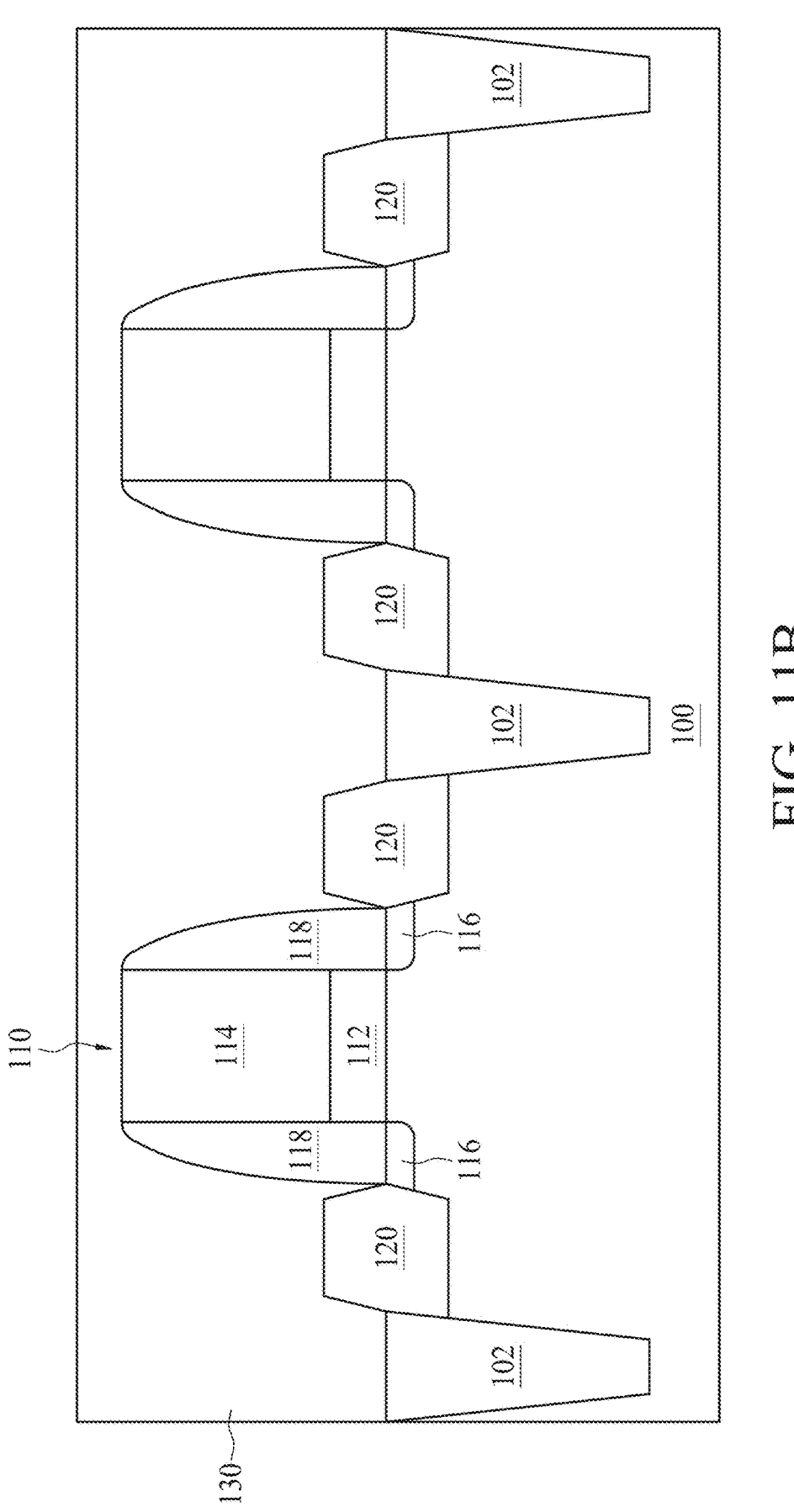

In operation 213 of FIG. 3, an inter-layer dielectric (ILD) layer 130 is formed over the substrate 100, as shown in FIG. 11A or FIG. 11B. The ILD layer 130 may be formed by depositing a dielectric material onto the isolation structures 102, the epitaxial features 120, the dummy gate structures 110, the gate spacers 118 and the etch-stop layer using spin-on coating, CVD, ALD, and/or other suitable methods. In some embodiments, the dielectric material of the ILD layer 130 includes silicon oxide, silicon nitride, undoped silicate glass (USG), phospho-silicate glass (PSG), boro-silicate glass (BSG), boron-doped phospho-silicate glass (BPS G), tetraethyl orthosilicate (TEOS), or other suitable materials. In some embodiments, the dielectric material of the ILD layer 130 includes an extreme low-k (ELK) dielectric material, which has a dielectric constant between 2.0 and 3.0. A planarization operation, such as CMP, may be used to remove any excess dielectric material over the dummy gate structure 110. In some embodiments, the planarization operation removes the ILD layer 130 over the top surface of the dummy gate structure 110. In such embodiments, top surfaces of the planarized ILD layer 130 and the dummy gate structure 110 are substantially coplanar. The top surface of the dummy gate structure 110 may be exposed, as shown in FIG. 11A. In some other embodiments, the planarization operation planarizes the ILD layer 130 without exposing the top surface of the dummy gate structure 110. In such embodiments, the top surface of the planarized ILD layer 130 is higher than the top surface of the dummy gate structure 110, as shown in FIG. 11B.

Figure 12:
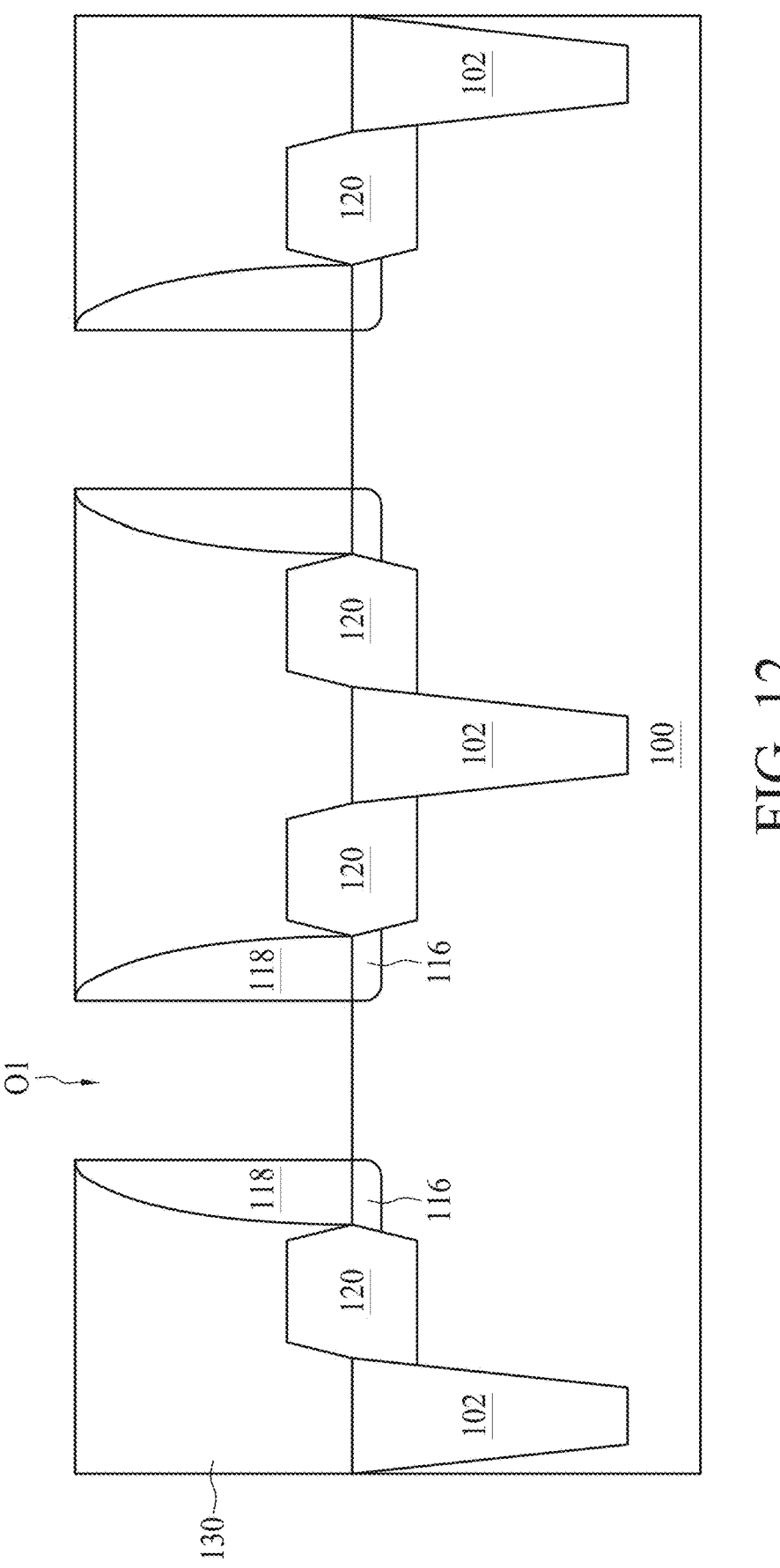

In operation 215 of FIG. 3, the dummy gate structures 110 are replaced by functional gate structures 140, as shown in FIGS. 12 to 22B. Referring to FIG. 12, the dummy gate structures 110 are removed. The removal of the dummy gate structures 110 may include at least a lithographic operation and an etching operation. A patterned photoresist layer (not shown) may be used as an etching mask during the etching operation. The etching operation may include any acceptable anisotropic or isotropic etching method, such as RIE, dry etching, wet etching or another suitable method. The etching operation may be selective to the materials of the dummy gates 114 and the dummy gate dielectrics 112. During the etching operation, the dummy gate dielectrics 112 may be used as an etch-stop layer when the dummy gates 114 are etched. The dummy gate dielectrics 112 may then be etched after removal of the dummy gates 114. After the dummy gates 114 and the dummy gate dielectrics 112 are removed, multiple openings O1 exposing the underlying substrate 100 are formed. In some embodiments, the size of each opening O1 is defined by corresponding gate spacers 118. Each opening O1 may expose a channel region located between a corresponding pair of epitaxial features 120 and in the substrate 100.

Figure 13:
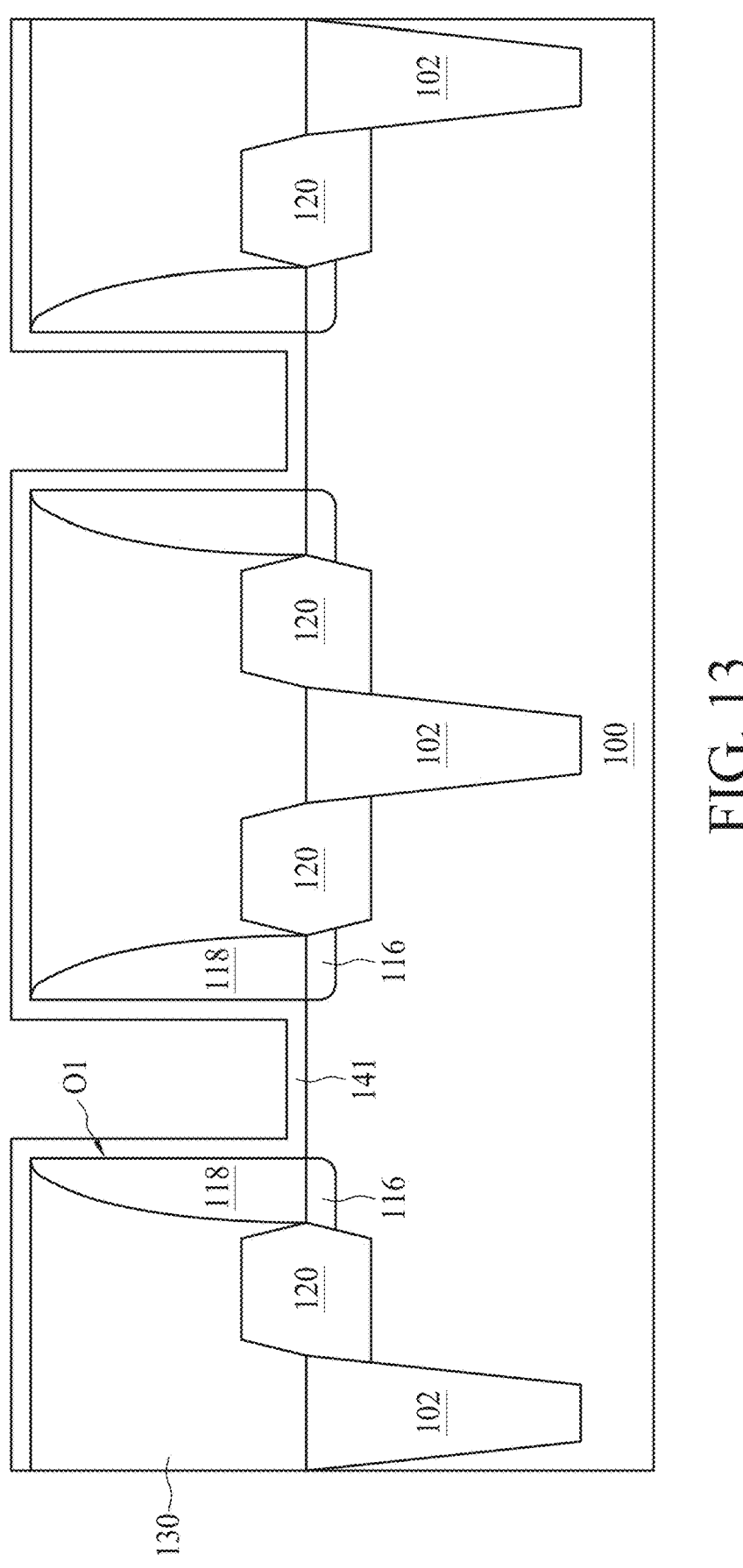

Referring to FIG. 13, a gate dielectric layer 141 is conformally formed on the top surface of the ILD layer 130 and in the opening O1. The gate dielectric layer 141 may cover inner sidewalls of the gate spacers 118 and portions of the substrate 100. The gate dielectric layer 141 may be formed using ALD, CVD or other suitable methods. In some embodiments, the gate dielectric layer 141 includes a high-dielectric constant (high-k) dielectric material, and in such embodiments, the gate dielectric layer 141 may have a dielectric constant greater than about 7.0 and may include a metal oxide or a silicate of Hf, Al, Zr, La, Mg, Ba, Ti, Pb, or a combination thereof. The gate dielectric layer 141 may include $HfO_2$, HfSiO, HfSiON, HfTaO, HfTiO, HfZrO, other suitable high-k dielectric materials. Prior to the formation of the gate dielectric layer 141, an interfacial dielectric layer can be formed in each opening O1 and on the substrate 100. The interfacial dielectric layer may be, for example, an oxide formed by thermal oxidation, chemical oxidation, ALD or another suitable method.

Figure 14:
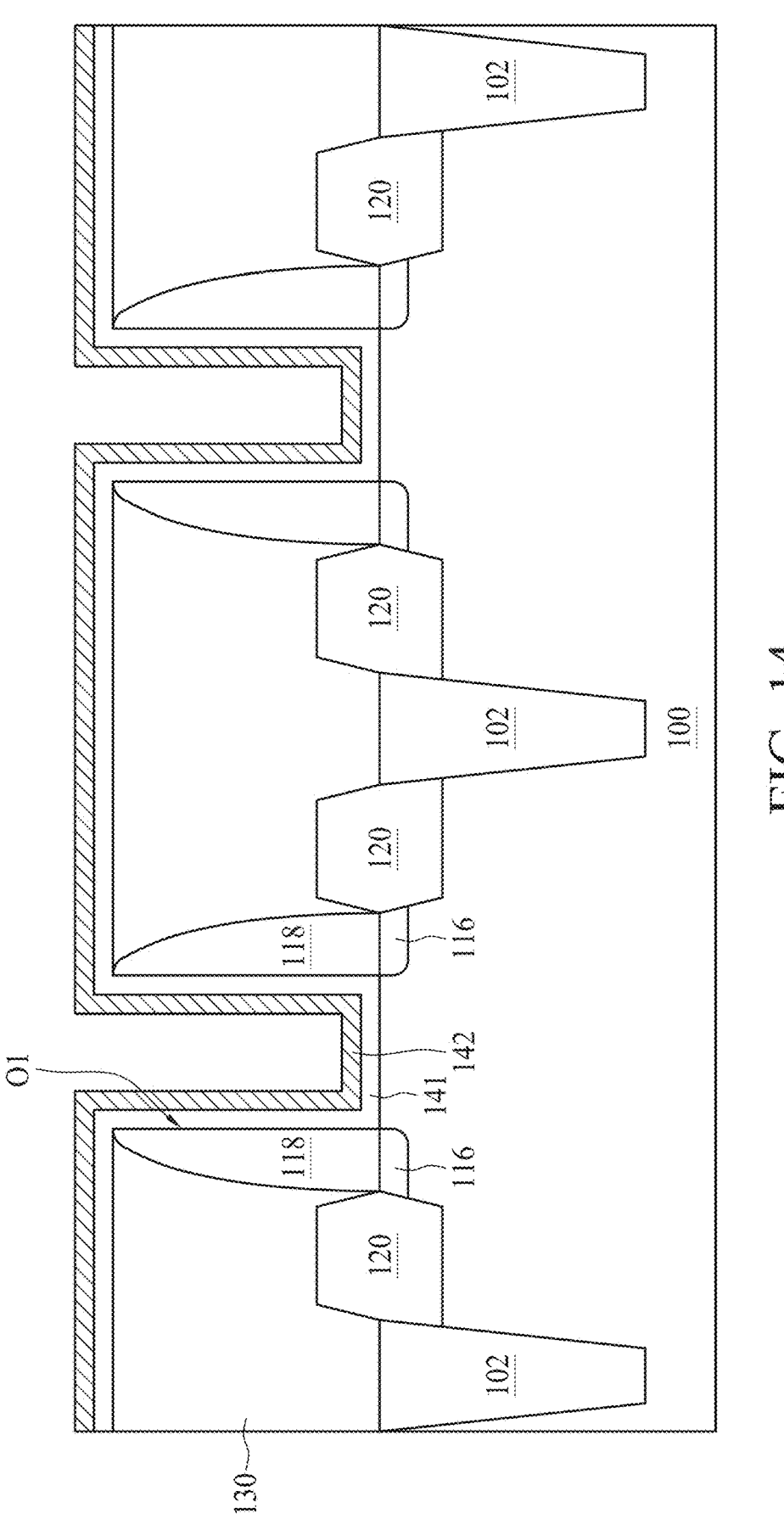

Referring to FIG. 14, a diffusion-blocking layer 142 is conformally formed on the gate dielectric layer 141. The diffusion-blocking layer 142 may be formed using ALD, CVD or other suitable methods. In some embodiments, the diffusion-blocking layer 142 is a single layer. In some other embodiments, the diffusion-blocking layer 142 includes multiple sub-layers. In some embodiments, the diffusion-blocking layer 142 includes titanium nitride (TiN), tantalum nitride (TaN), the like, or a combination thereof. The diffusion-blocking layer 142 may be used to prevent a subsequently-deposited metal-containing material from diffusing into the gate dielectric layer 141.

Figure 15:
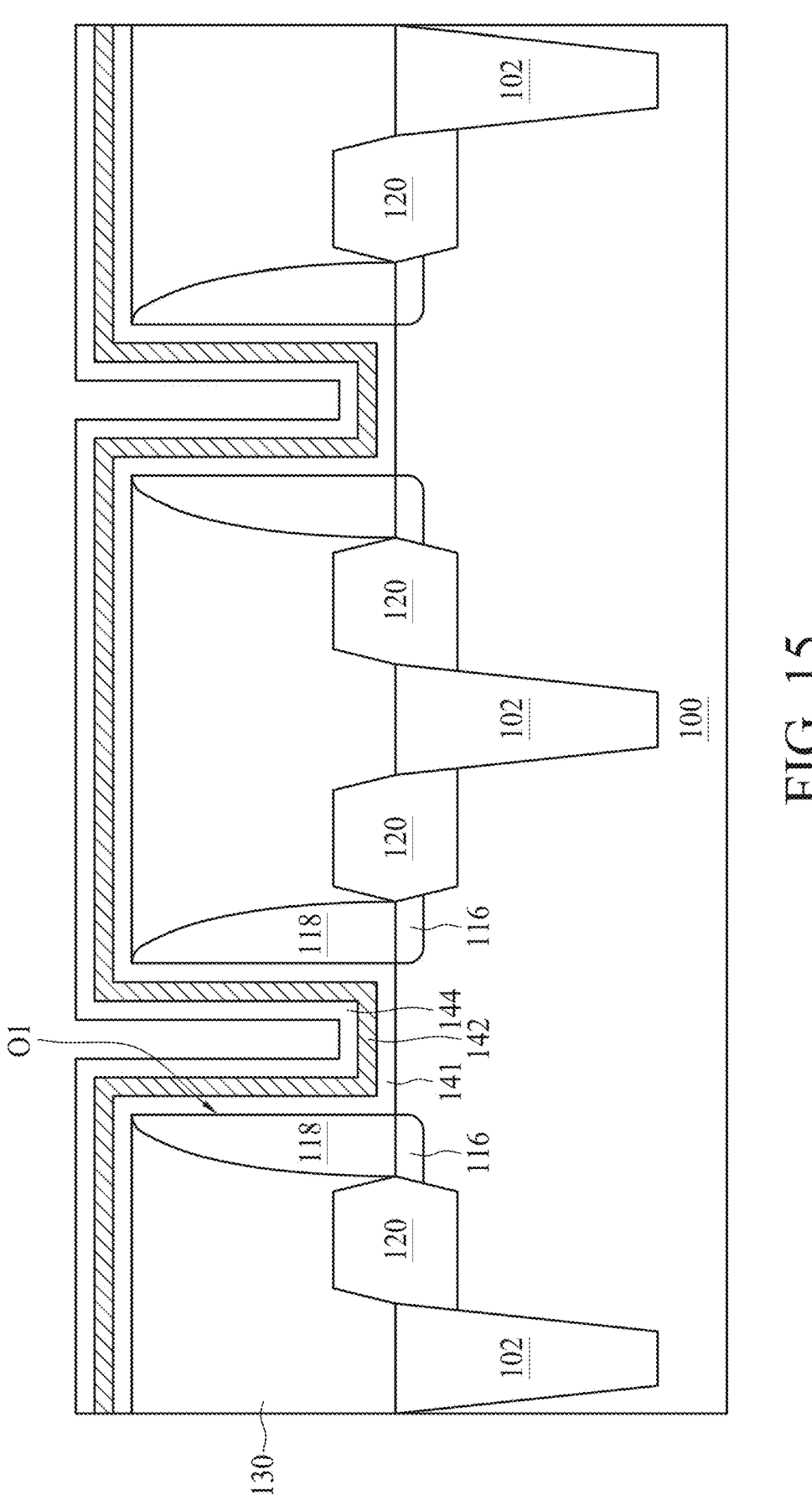

Referring to FIG. 15, a work function layer 144 is conformally formed on the diffusion-blocking layer 142. The work function layer 144 may be formed using ALD, CVD or other suitable methods. In some embodiments, the work function layer 144 is a single layer. In some other embodiments, the work function layer 144 includes multiple sub-layers. In some embodiments, a gate material with a work function that can place its Fermi level close to the middle of the band gap of silicon is required. Therefore, in order to tailor a threshold voltage $(V_{TH})$ of the functional gate structure 140 that is to be formed, the gate material for forming the functional gate structure 140 should have a tunable work function. The work function layer 144 may be a suitable material used to tune a work function of the functional gate structure 140 to a desired level. In such embodiments, the work function layer 144 includes TiN, TaN, tungsten nitride (WN), the like, or a combination thereof.

Figure 16A:
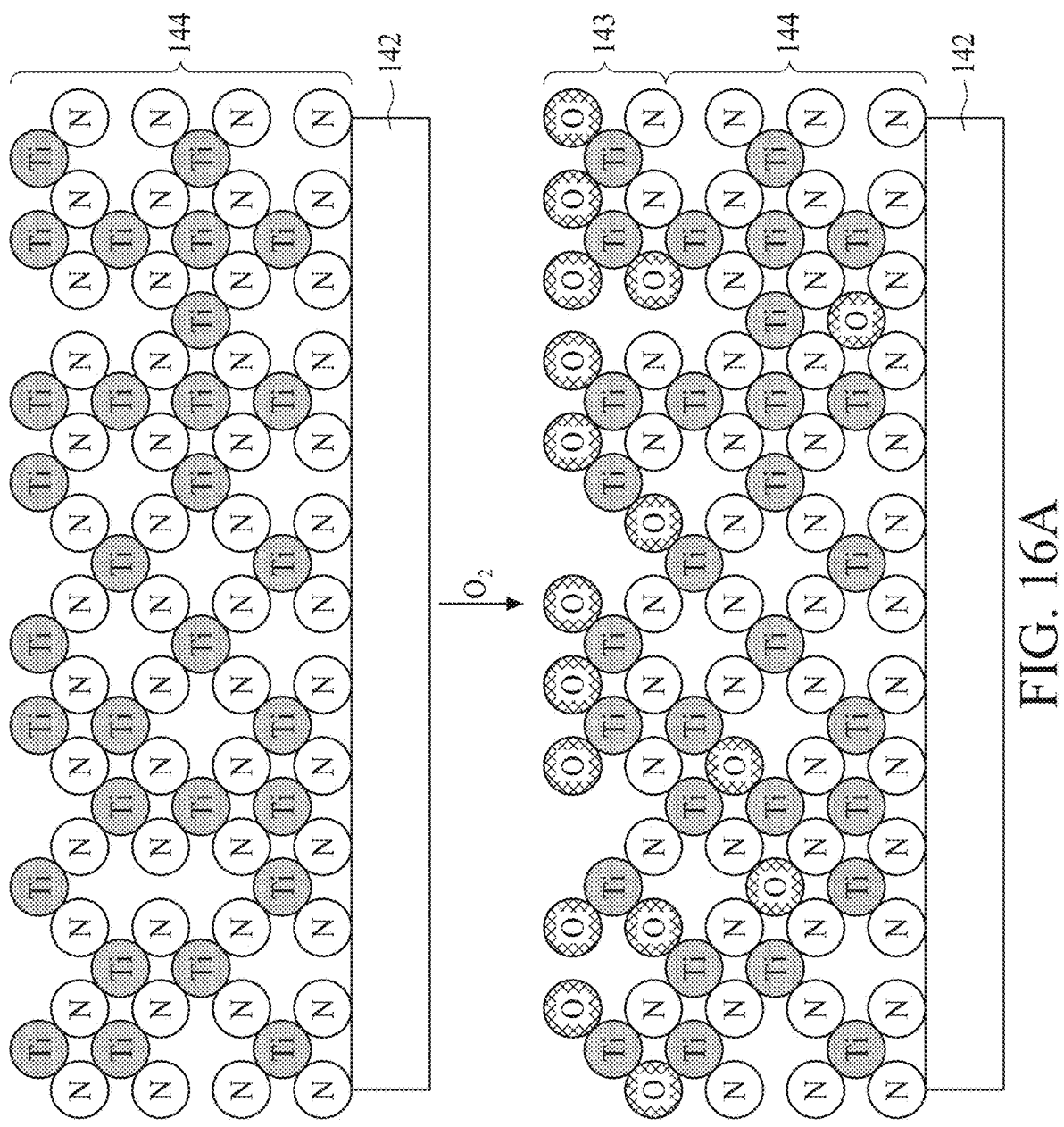

FIGS. 16A, 16B, 17A, 17B, 17C, 18A, 18B and 18C are enlarged views of the work function layer 144 in FIG. 15. Referring to FIG. 16A, shortly after the work function layer 144 is formed, oxygen $(O_2)$ in an ambient environment (for example, in the fab), may diffuse and react with the work function layer 144. A top surface of the work function layer 144 may be oxidized. An oxide layer 143 may be formed on the top surface of the work function layer 144. The oxide layer 143 may include titanium oxide, tantalum oxide or tungsten oxide. Furthermore, some oxygen may diffuse into the lattice structure of the work function layer 144. The oxidized work function layer 144 may lose its capability of adjusting the threshold voltage of the functional gate structure 140. If the oxide layer 143 is not removed, the oxide layer 143 remained between the work function layer 144 and a subsequently formed gate electrode may cause the threshold voltage of the thereby formed semiconductor device to have a large variation.

Figure 16B:
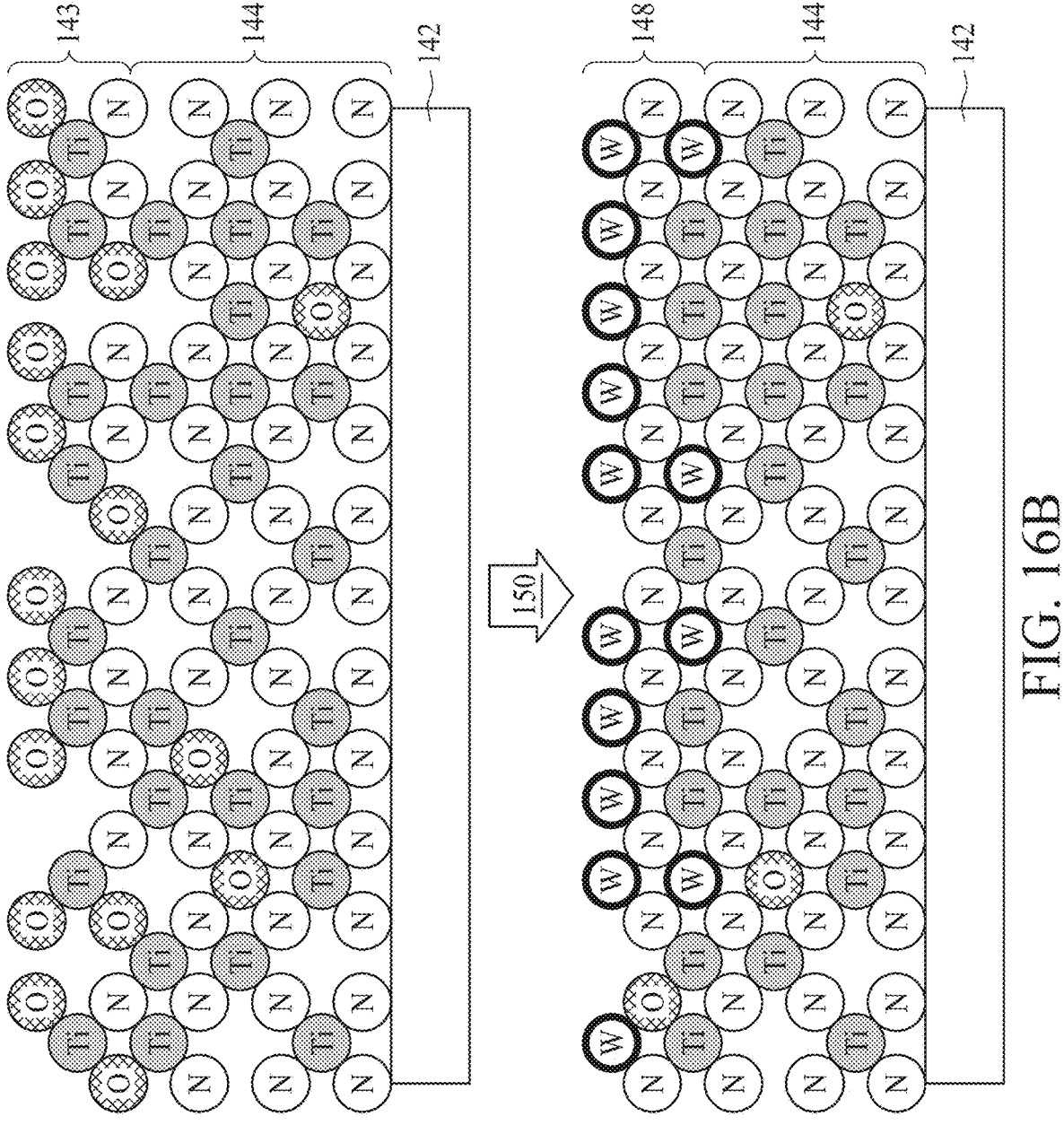

Referring to FIG. 16B, in some embodiments, an atomic layer etching (ALE) operation 150 is used to remove the oxide layer 143. ALE is a technique for removing thin layers of material using sequential reaction steps which are self-limiting. In some embodiments, a metal halide compound is used to react with the oxide layer 143 in the ALE operation 150. The metal halide compound may include tungsten chloride, molybdenum chloride, niobium chloride or other suitable compounds. A redox reaction may take place between the oxide layer 143 and the metal halide compound, and thus the oxide layer 143 can be removed. In some embodiments, after the ALE operation 150, the metal ion of the metal halide compound is reduced to form a metal layer 148 on the top surface of the work function layer 144. The metal layer 148 may include tungsten (W), molybdenum (Mo) or niobium (Nb).

Figure 17A:
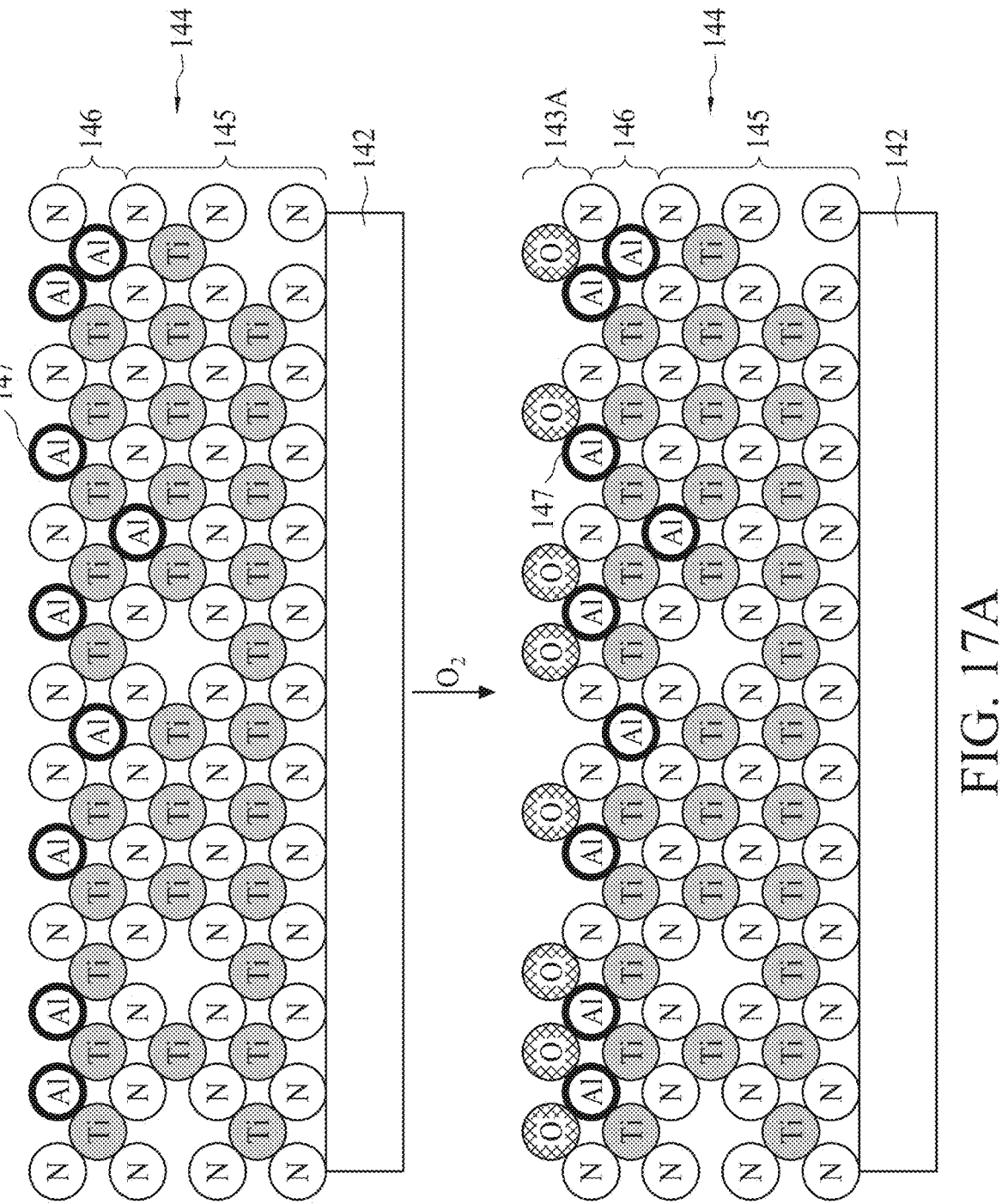
Figure 17B:
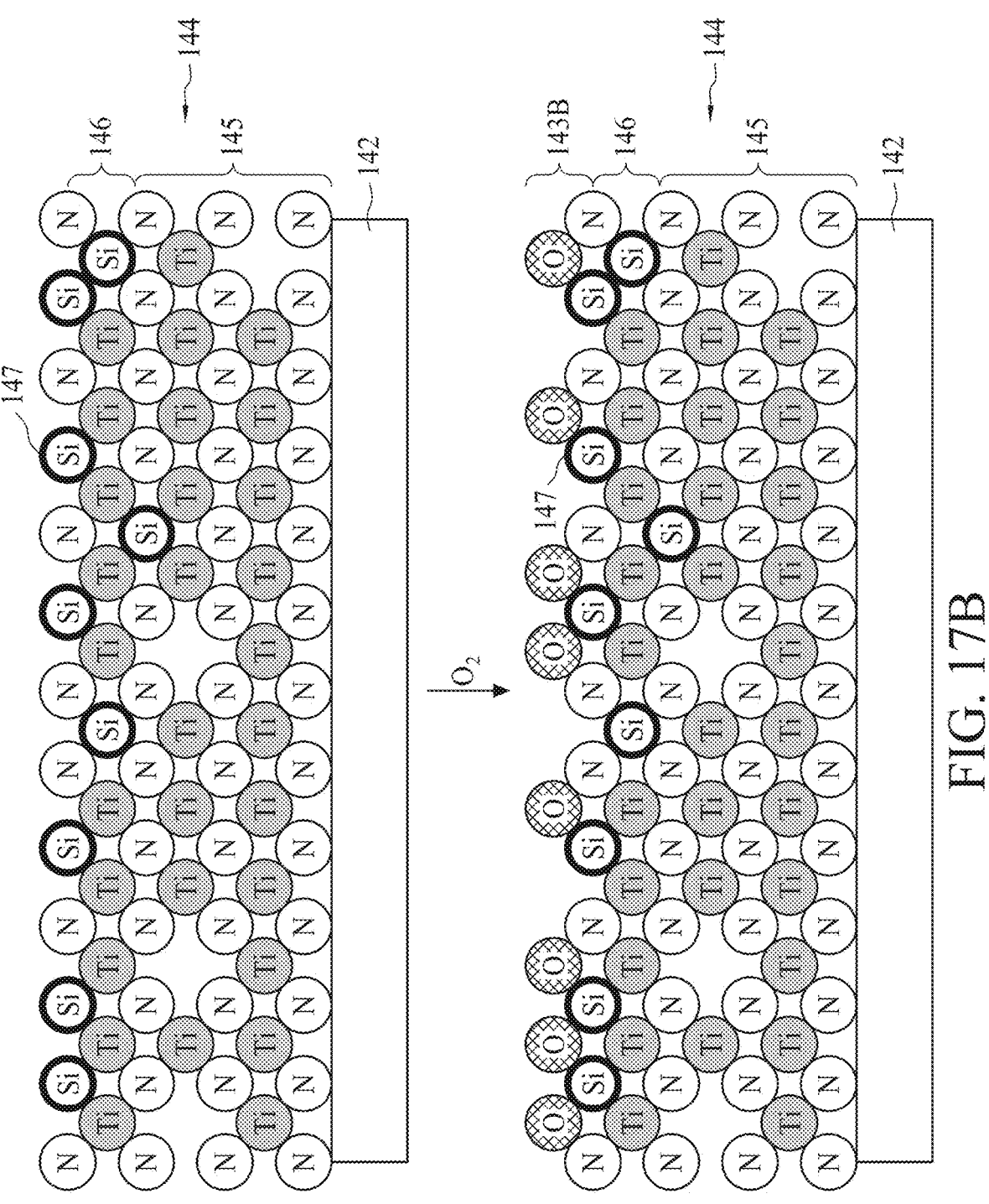
Figure 17C:
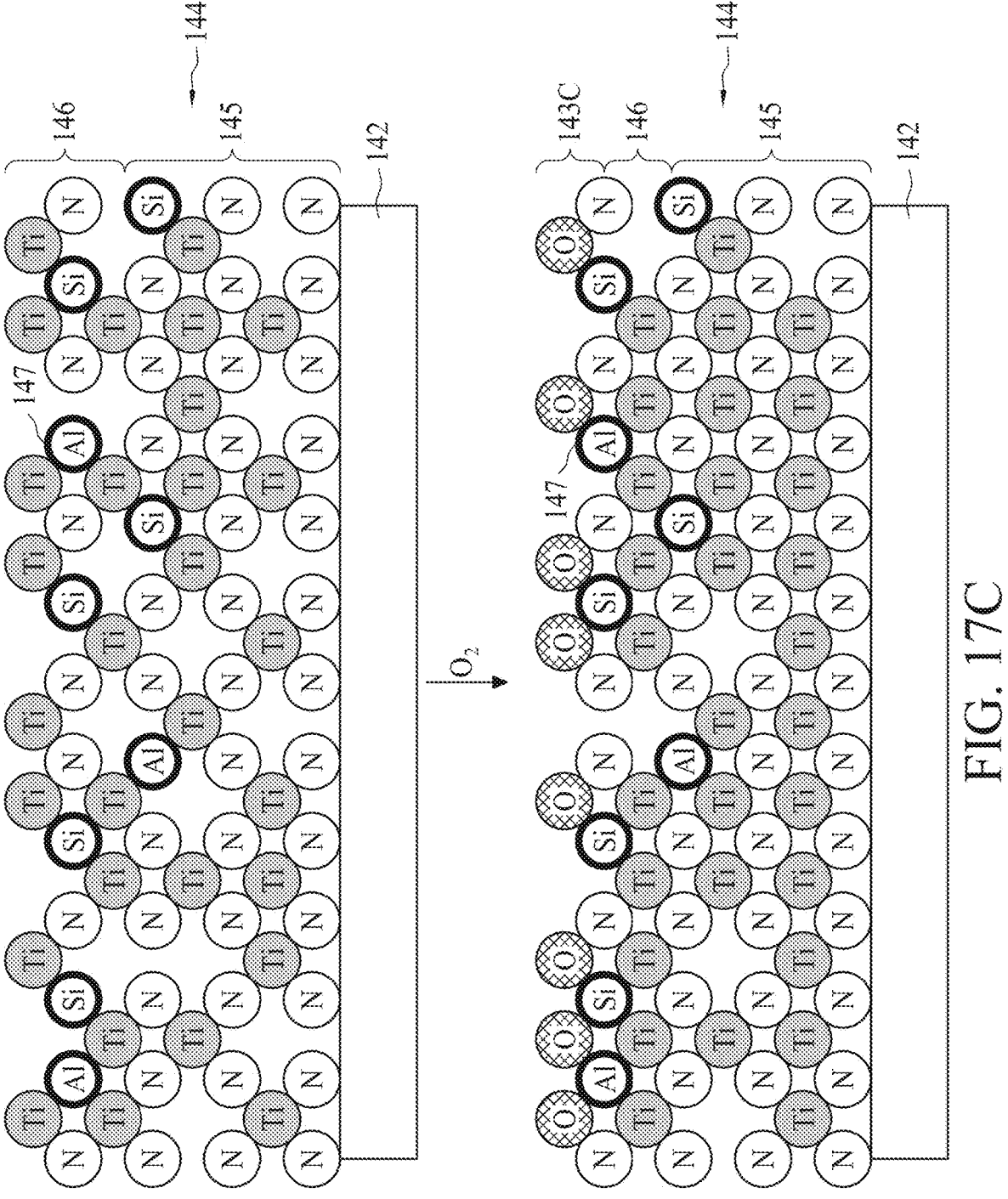

In some embodiments, the work function layer 144 may be formed in two stages, as shown in FIGS. 17A to 17C. Referring to FIG. 17A, a first portion 145 of the work function layer 144 is formed on a top surface of the diffusion-blocking layer 142 in a first stage. In the first stage, only precursor compounds of TiN or TaN such as titanium chloride $(TiCl_4)$ or tantalum chloride $(TaCl_4)$ and ammonia $(NH_3)$ are injected into the ALD chamber. After a reaction between $TiCl_4$ or $TaCl_4$ with $NH_3$, TiN or TaN may be formed. The TiN or TaN is deposited to a predetermined thickness to form the first portion 145 before the second stage begins.

Subsequently, a second portion 146 of the work function layer 144 is formed over the first portion 145 in the second stage. The first portion 145 and the second portion 146 may be formed in the same ALD chamber. In some embodiments, multiple barrier elements 147 are formed on or under a top surface of the second portion 146. In the second stage, the precursor compounds of TiN or TaN and a precursor compound of aluminum (Al) atoms such as triethylaluminium (TEAL) or trimethylaluminium (TMA) are simultaneously injected into the ALD chamber. Therefore, titanium aluminum nitride (TiAlN) or tantalum aluminum nitride (TaAlN) may be formed in the second stage. In such embodiments, the second portion 146 is made of TiAlN or TaAlN, and the barrier elements 147 include Al atoms.

In some other embodiments, the precursor compounds of TiN or TaN and the precursor compound of Al are separately injected into the ALD chamber. The precursor compounds of TiN or TaN and the precursor compound of Al may be injected into the ALD chamber sequentially and alternately. For example, $TiCl_4$ or $TaCl_4$ and $NH_3$ may be firstly injected into the ALD chamber to form TiN or TaN, followed by purging argon (Ar) or nitrogen $(N_2)$ to remove by-products, and then TEAL or TMA is injected into the ALD chamber to form Al atoms. Subsequently, the above operation is repeated in cycles until a predetermined amount of Al atoms are formed. In some embodiments, a duration of the precursor compound of Al injected into the ALD chamber is gradually increased in continuous cycles. For example, a duration in the first cycle may last for 5 seconds (s), a duration in the second cycle may last for 10 s, a duration in the third cycle may last for 15 s, and the like. That is, the Al atoms are formed by fractionally and sequentially injecting TEAL or TMA into the ALD chamber. In some embodiments, a total duration of injecting TEAL or TMA into the ALD chamber is between about 20 s and 40 s. As a result, Al atoms may be formed on TiN or TaN. In such embodiments, the barrier elements 147 are doped into the second portion 146. That is, the second portion 146 is made of TiN doped with Al atoms or TaN doped with Al atoms. In some embodiments, the barrier elements 147 are located on or under a top surface of the second portion 146. In some embodiments, a distribution of the Al atoms gradually increases toward the top surface of the second portion 146 of the work function layer 144.

Still referring to FIG. 17A, the barrier elements 147 may function as oxygen-trapping elements since $O_2$ has a strong affinity to Al atoms. The affinity between Al and $O_2$ may be stronger than that between Ti or Ta and $O_2$. Al atoms may function as a barrier element that prevents $O_2$ from oxidizing the work function layer 144. In some embodiments, before an operation for forming a structure, a gate electrode for example, on the work function layer 144, $O_2$ is blocked outside the second portion 146 instead of diffusing into the work function layer 144. $O_2$ may be adsorbed or bonded on surfaces of the Al atoms of the second portion 146. Al and $O_2$ may form an oxide layer 143A on the top surface of the second portion 146. The oxide layer 143A may be aluminum oxide.

Referring to FIG. 17B, in some other embodiments, the barrier elements 147 include silicon (Si) atoms. In some embodiments, the precursor compounds of TiN or TaN and a precursor compound of Si such as silane ($SiH_4$) are simultaneously injected into the ALD chamber in the second stage. Therefore, titanium silicon nitride (TiSiN) or tantalum silicon nitride (TaAlN) may be formed in the second stage. In such embodiments, the second portion 146 is made of TiSiN or TaSiN.

In some other embodiments, the precursor compounds of TiN or TaN and the precursor compound of Si are separately injected into the ALD chamber. The precursor compounds of TiN or TaN and the precursor compound of Si may be injected into the ALD chamber sequentially and alternately. For example, $TiCl_4$ or $TaCl_4$ and $NH_3$ may be firstly injected into the ALD chamber to form TiN or TaN, followed by purging Ar or $N_2$ to remove by-products, and then $SiH_4$ is injected into the ALD chamber to form Si atoms. Subsequently, the above operation is repeated in cycles until a predetermined amount of Si atoms are formed. In some embodiments, a duration of the precursor compound of Si injected into the ALD chamber is gradually increased in continuous cycles. For example, a duration in the first cycle may last for 5 s, a duration in the second cycle may last for 10 s, a duration in the third cycle may last for 15 s, and the like. That is, the Si atoms are formed by fractionally and sequentially injecting $SiH_4$ into the ALD chamber. In some embodiments, a total duration of injecting $SiH_4$ into the ALD chamber is between about 20 s and 40 s. As a result, Si atoms may be formed on TiN or TaN. In such embodiments, the barrier elements 147 are doped into the second portion 146. That is, the second portion 146 is made of TiN doped with Si atoms or TaN doped with Si atoms. In some embodiments, a distribution of the Si atoms gradually increases toward the top surface of the second portion 146 of the work function layer 144.

Still referring to FIG. 17B, the Si atoms of the barrier elements 147 may function as an oxygen-trapping element since $O_2$ has a strong affinity to Si atoms. The affinity between Si and $O_2$ may be stronger than that between Ti or Ta and $O_2$. Si atoms may function as a barrier element that prevents $O_2$ from oxidizing the work function layer 144. In some embodiments, before an operation for forming a structure, a gate electrode for example, on the work function layer 144, $O_2$ is blocked outside the second portion 146 instead of diffusing into the work function layer 144. $O_2$ may be adsorbed or bonded on surfaces of the Si atoms of the second portion 146. Si and $O_2$ may form an oxide layer 143B on the top surface of the second portion 146. The oxide layer 143B may be silicon oxide.

Referring to FIG. 17C, in some other embodiments, the barrier elements 147 include Al atoms and Si atoms. In some embodiments, the precursor compounds of TiN or TaN and the precursor compounds of Al and Si are simultaneously injected into the ALD chamber in the second stage. Therefore, titanium aluminum silicon nitride (TiAlSiN) or tantalum aluminum silicon nitride (TaAlSiN) may be formed in the second stage. In such embodiments, the second portion 146 is made of TiAlSiN or TaAlSiN.

In some other embodiments, the precursor compounds of TiN or TaN and the precursor compounds of Al and Si are separately injected into the ALD chamber. The precursor compounds of TiN or TaN and the precursor compounds of Al and Si may be injected into the ALD chamber sequentially and alternately. For example, $TiCl_4$ or $TaCl_4$ and $NH_3$ may be firstly injected into the ALD chamber to form TiN or TaN, followed by purging Ar or $N_2$ to remove by-products, and then TEAL or TMA is injected into the ALD chamber to form Al atoms, followed by purging Ar or $N_2$ to remove by-products, and then $SiH_4$ is injected into the ALD chamber to form Si atoms. Subsequently, the above operation is repeated in cycles until a predetermined amount of Al atoms and Si atoms are formed. In some embodiments, durations of the precursor compounds of Al and Si injected into the ALD chamber are gradually increased in continuous cycles. For example, a duration in the first cycle may last for 5 seconds (s), a duration in the second cycle may last for 10 s, a duration in the third cycle may last for 15 s, and the like. That is, the Al atoms and Si atoms are formed by fractionally and sequentially injecting TEAL or TMA and $SiH_4$ into the ALD chamber. In some embodiments, a total duration of injecting TEAL or TMA and $SiH_4$ into the ALD chamber is between about 20 s and 40 s. As a result, Al atoms and Si atoms may be formed on TiN or TaN. In such embodiments, the second portion 146 is made of TiN doped with Al and Si atoms or TaN doped with Al and Si atoms. That is, Al and Si atoms may be doped into the second portion 146 of the work function layer 144. In some embodiments, Al and Si atoms are located on or under the top surface of the second portion 146. In some embodiments, a distribution of the Al and Si atoms gradually increases toward the top surface of the second portion 146 of the work function layer 144.

Still referring to FIG. 17C, the Al and Si atoms of the second portion 146 may function as oxygen-trapping elements. Al atoms and Si atoms may at the same time function as barrier elements that prevent $O_2$ from oxidizing the work function layer 144. In some embodiments, before an operation for forming a structure, a gate electrode for example, on the work function layer 144, $O_2$ is blocked outside the second portion 146 instead of diffusing into the work function layer 144. Si and $O_2$ may form an oxide layer 143C on the top surface of the second portion 146. The oxide layer 143C may include aluminum oxide and silicon oxide.

Figure 18A:
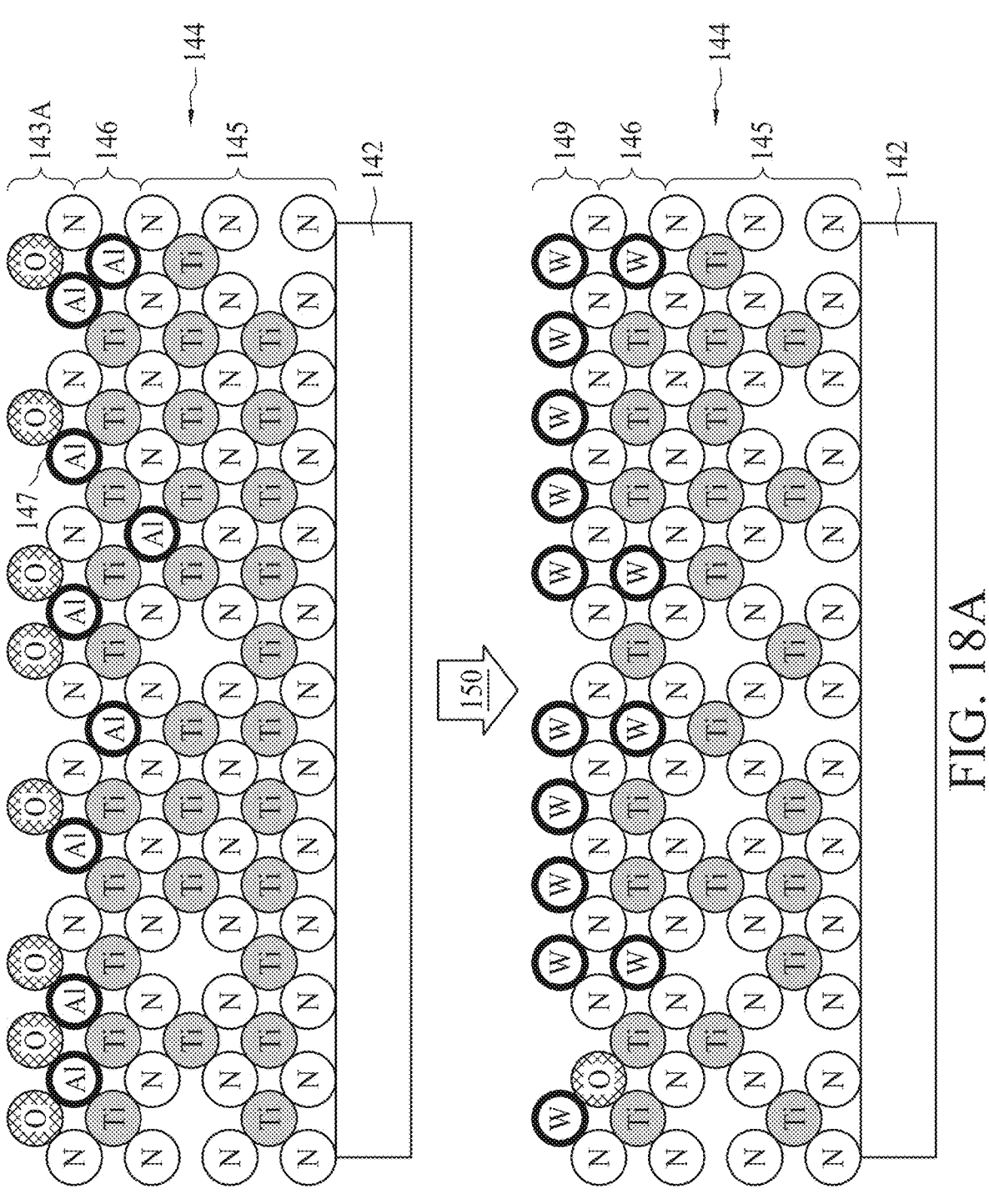
Figure 18B:
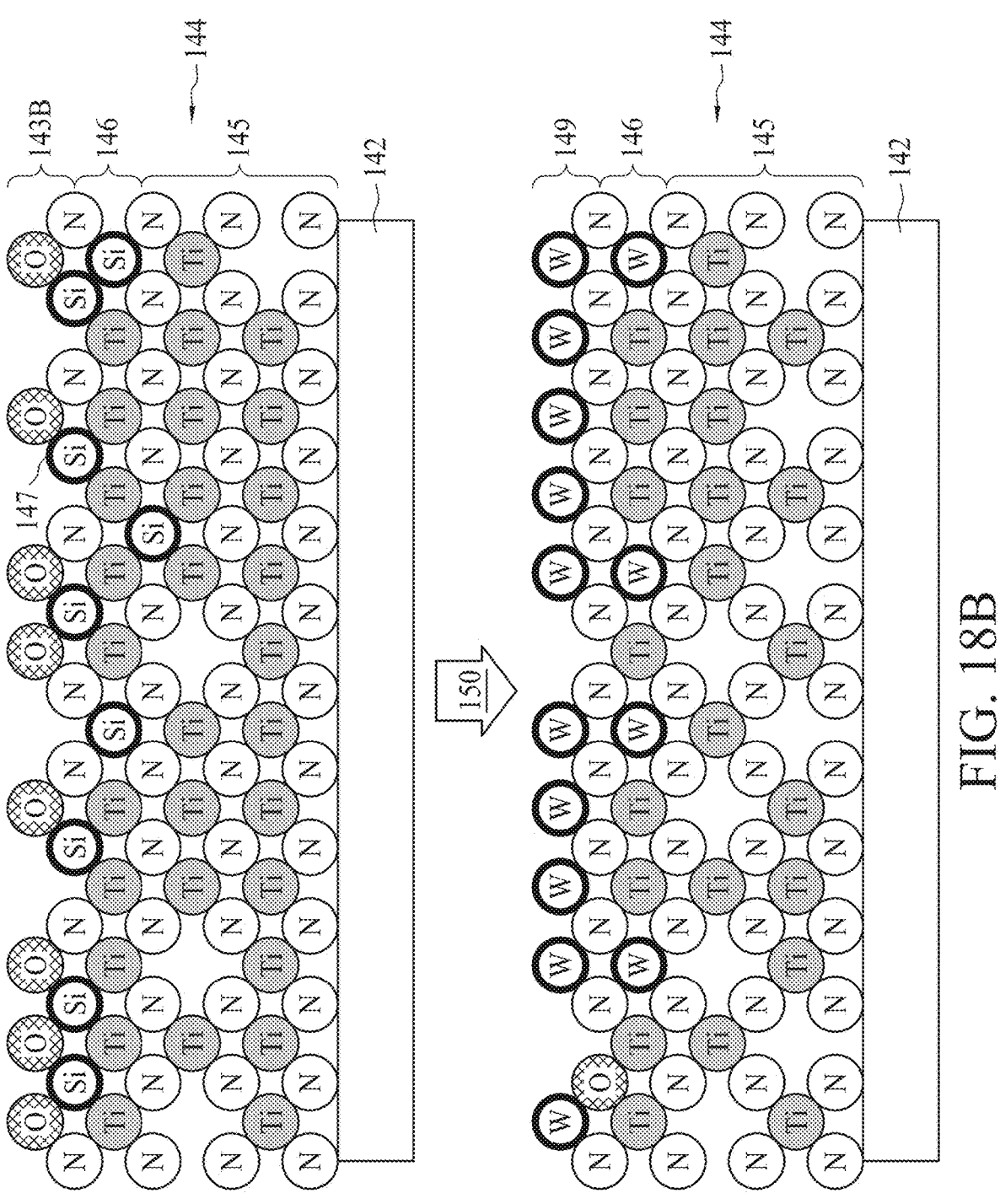
Figure 18C:
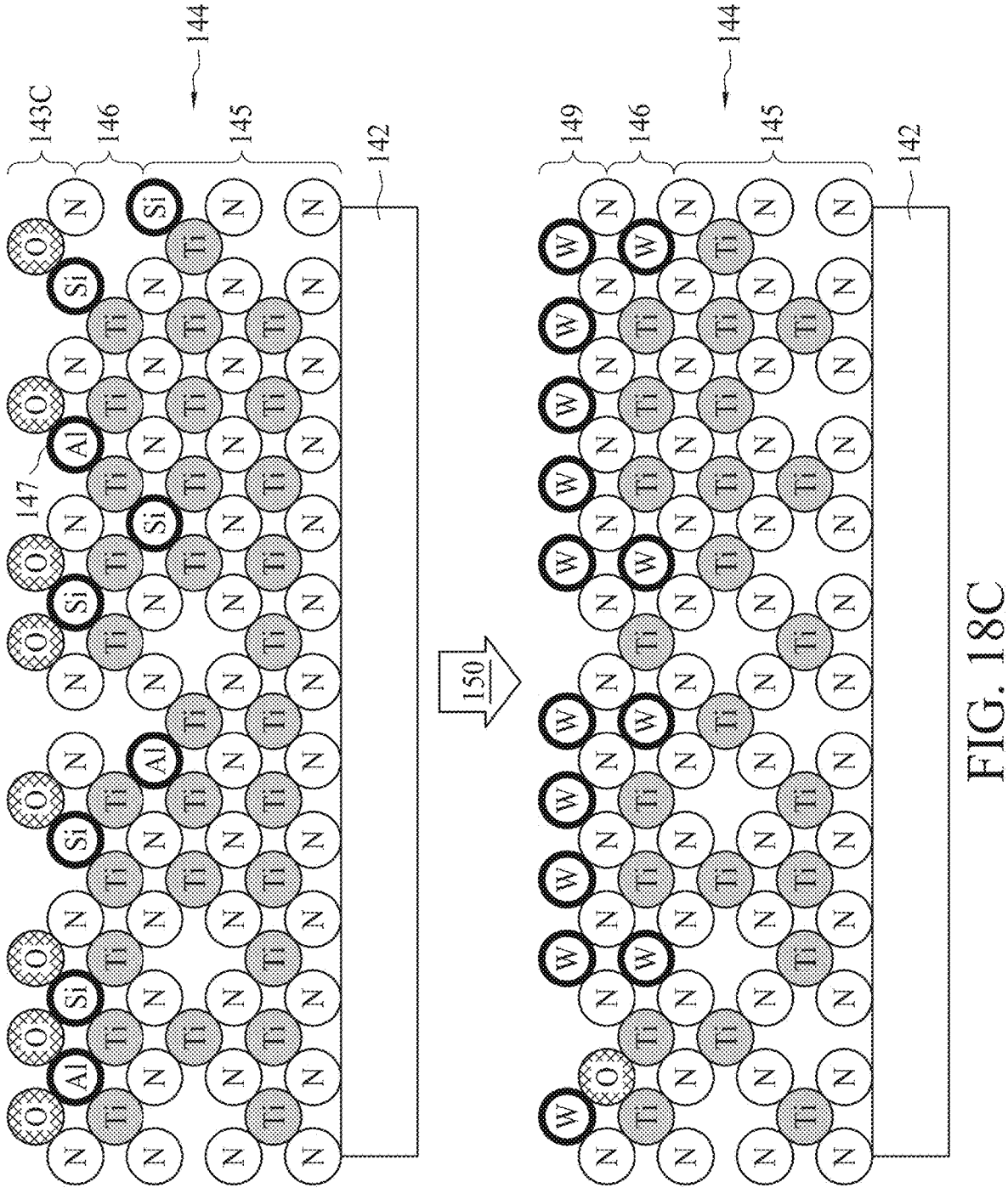

Referring to FIGS. 18A to 18C, in some embodiments, the ALE operation 150 is respectively used to remove the oxide layer 143A, oxide layer 143B and oxide layer 143C. In the ALE operation 150, a redox reaction may take place between the oxide layer 143A, 143B or 143C and a metal halide compound such as tungsten chloride, molybdenum chloride or niobium chloride, and thus the oxide layer 143A, 143B or 143C can be removed. In some embodiments, after the ALE operation 150, the metal ion of the metal halide compound is reduced to form a metal layer 149 on the second portion 146 of the work function layer 144. The metal layer 149 may include W, Mo or Nb.

Figure 19:
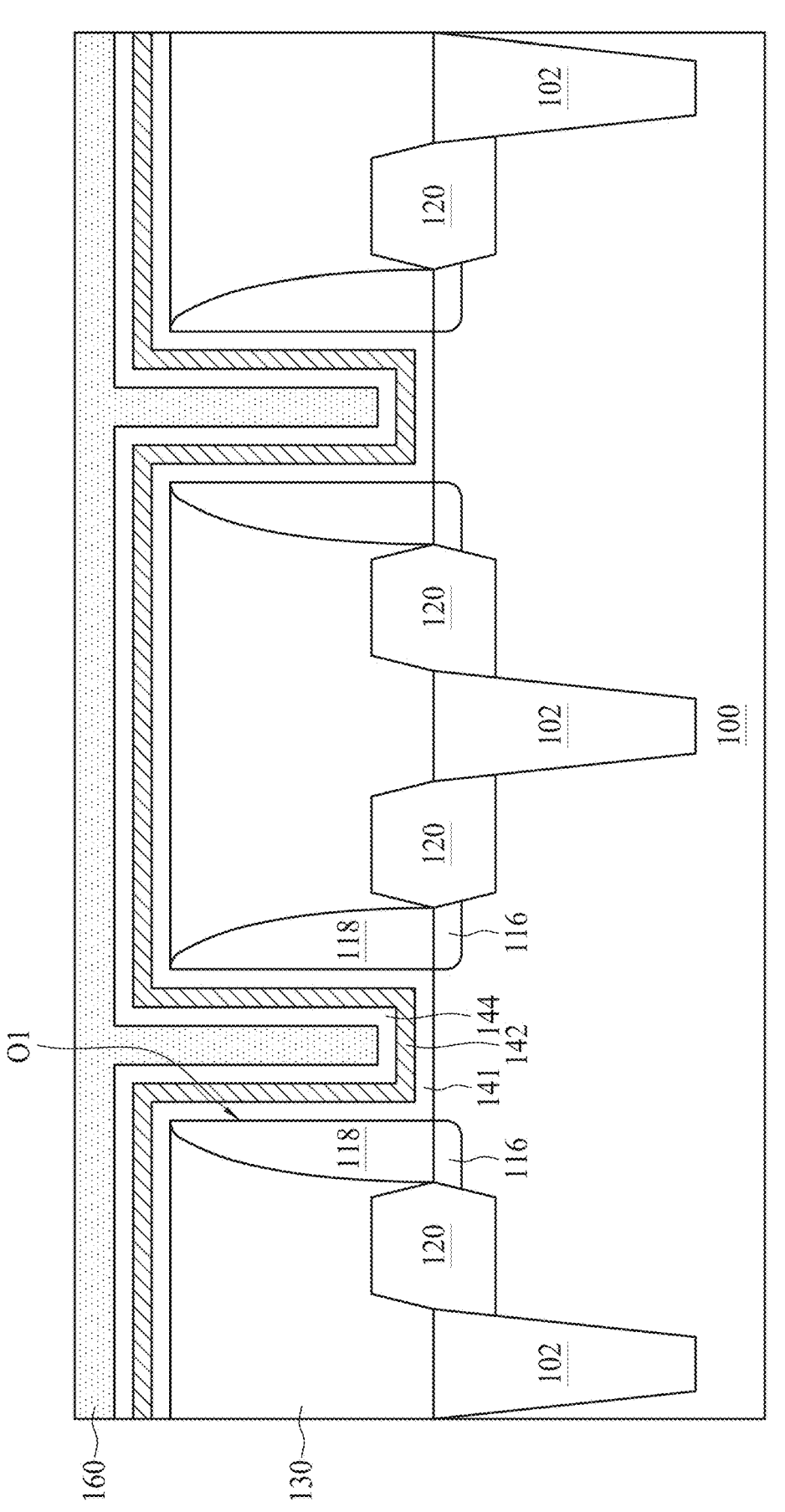

Referring to FIG. 19, a conductive layer 160 is conformally formed on the work function layer 144. The conductive layer 160 may be formed using physical vapor deposition (PVD), sputtering, electroplating, ALD or other suitable methods. The conductive layer 160 may include one or more conductive materials, such as W, Cu, Co, Al, Ni, Ta, Ti, Mo, Pd, Pt, Ru, Ir, Ag, Au, TiN, TaN, the like, or a combination thereof. In some embodiments, when the work function layer 144 has a U-shaped profile, the conductive layer 160 is deposited in a cavity surrounded by the work function layer 144. The conductive layer 160 may fill the unfilled portions of the openings O1.

Referring back to FIGS. 17A, 17B and 17C, during the deposition of the conductive layer 160, Al atoms and/or Si atoms on or in the second portion 146 may block $O_2$ from entering the work function layer 144. As a result, the chance of oxidation of the work function layer 144 can be greatly reduced.

Figure 20:
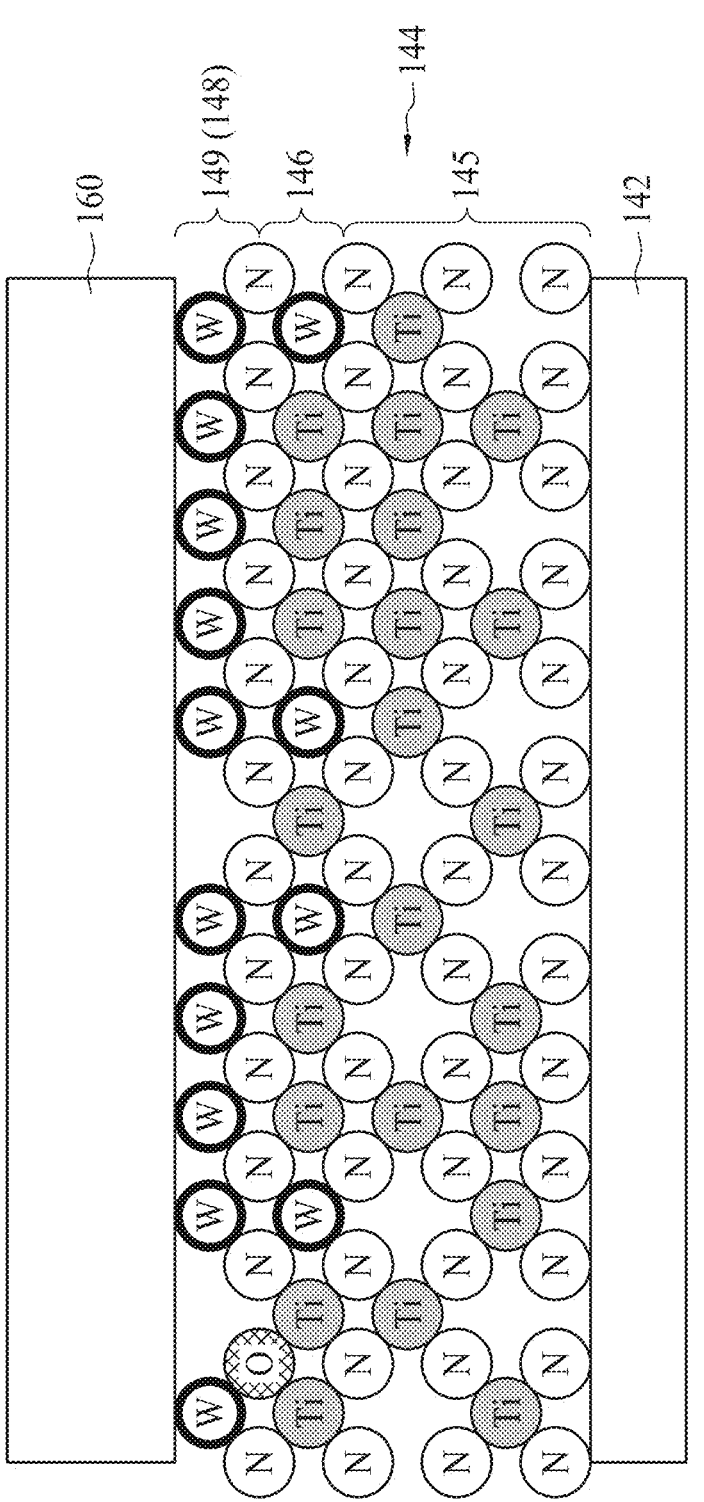

FIG. 20 is an enlarged view showing the work function layer 144 after the formation of the conductive layer 160. In some embodiments, the metal layer 148 or 149 is formed between the work function layer 144 and the conductive layer 160. An interface is between the metal layer 148 or 149 and the conductive layer 160 since the conductive materials of the metal layer 148 or 149 and the conductive layer 160 are formed at different time and may be different.

Figure 21:
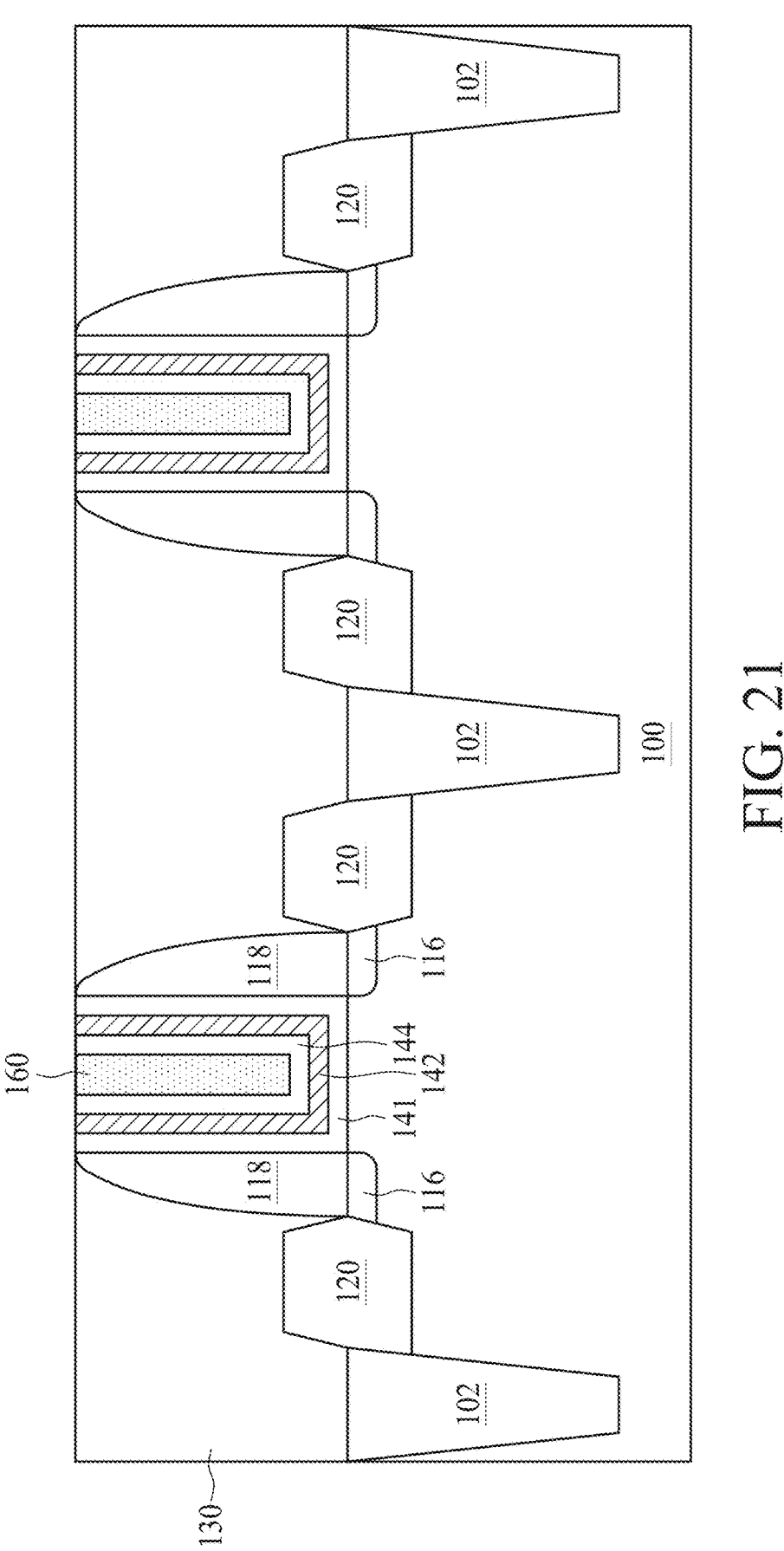

Continued from FIG. 19 and referring to FIG. 21, a planarization operation, such as CMP, may be used to remove portions of the conductive layer 160, the work function layer 144, the diffusion-blocking layer 142 and the gate dielectric layer 141 over the top surface of the ILD layer 130. Thus, remaining portions of the conductive layer 160, the work function layer 144, the diffusion-blocking layer 142 and the gate dielectric layer 141 may be disposed in the openings O1 and surrounded by the gate spacers 118.

Figure 22A:
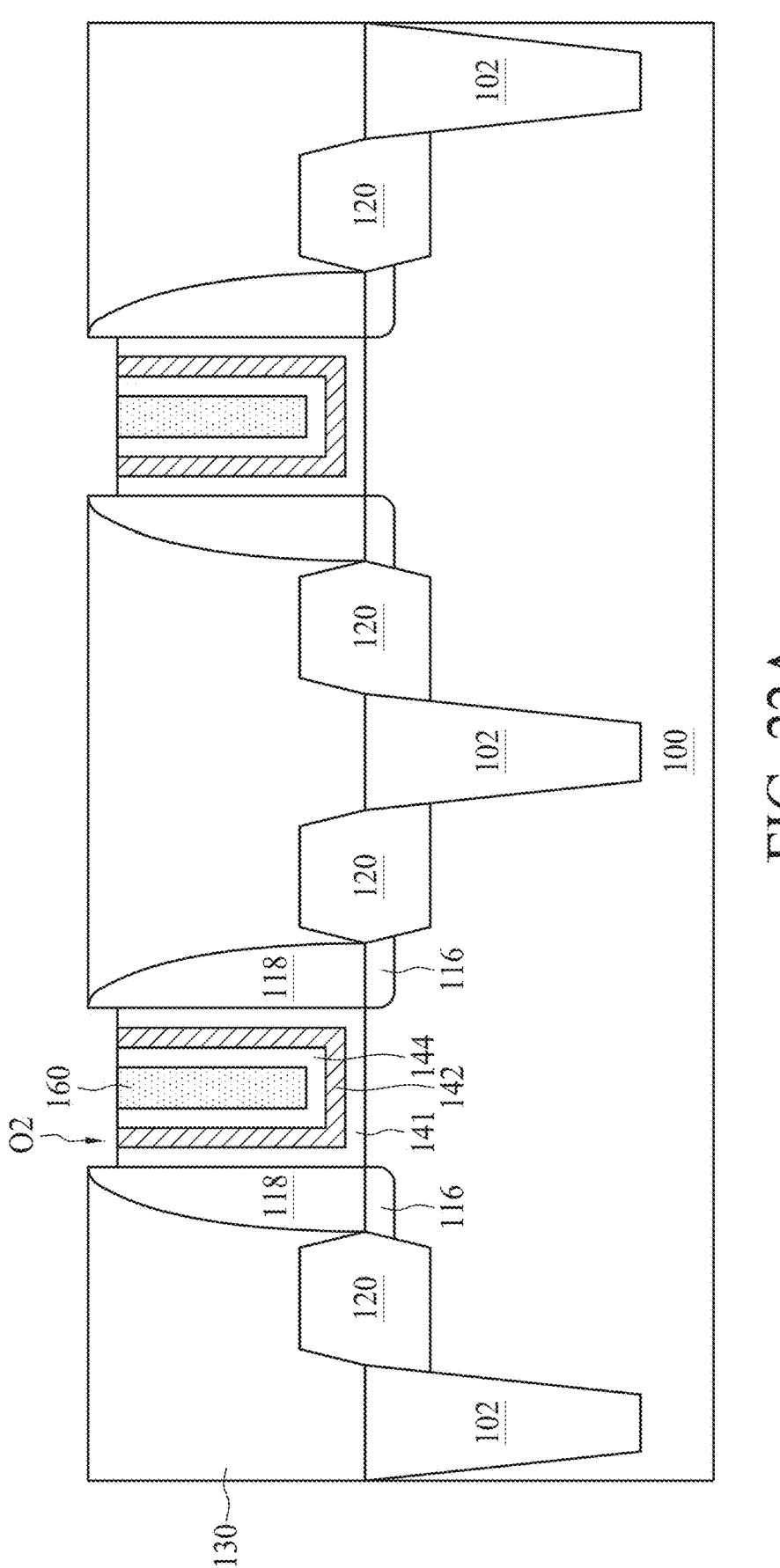
Figure 22B:
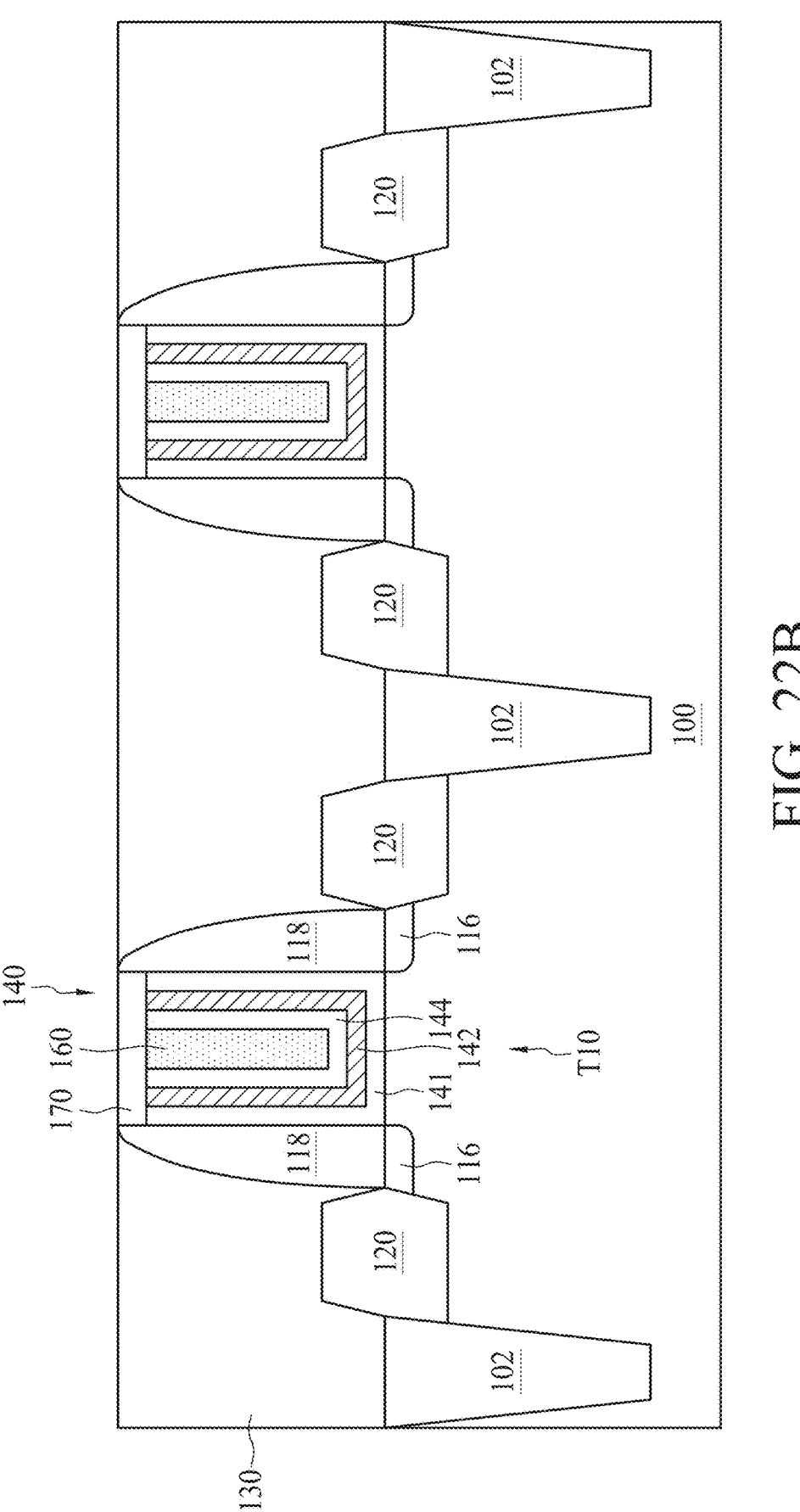

Referring to FIGS. 22A and 22B, a cap layer 170 is formed on the conductive layer 160, the work function layer 144, the diffusion-blocking layer 142 and the gate dielectric layer 141. Referring to FIG. 22A, a controlled etch-back operation is used to recess portions of the conductive layer 160, the work function layer 144, the diffusion-blocking layer 142 and the gate dielectric layer 141 such that an opening $O_2$ is formed in the ILD layer 130. A common top surface of the conductive layer 160, the work function layer 144, the diffusion-blocking layer 142 and the gate dielectric layer 141 may be lower than the top surface of the ILD layer 130. The etch-back operation may include RIE, dry etching or other suitable methods.

Referring to FIG. 22B, to form the cap layer 170, a dielectric material such as silicon nitride, silicon carbon nitride or the like may be deposited over the ILD layer 130 to fill space in openings created by the etch-back operation. The dielectric material may be deposited using CVD, PECVD or another suitable method. A planarization operation, such as CMP, can be used to level the top surface of the dielectric material such that top surfaces of the dielectric material and the ILD layer 130 are substantially coplanar, thereby forming the cap layer 170. At this stage, operations for forming the functional gate structure 140 are completed. The functional gate structure 140 may include the gate dielectric layer 141, the diffusion-blocking layer 142, the work function layer 144, the conductive layer 160 and/or the cap layer 170. The functional gate structure 140 may be surrounded by the gate spacer 118. The conductive layer 160 may function a gate electrode of the functional gate structure 140.

Comparing FIGS. 11A and 22B, each of the dummy gate structures 110 is replaced by a corresponding functional gate structure 140. The conversion of the dummy gate structure 110 into the functional gate structure 140 uses a method which may be referred to as a "replacement polysilicon gate (RPG)" technique. The RPG technique may also be called a "gate last" technique. After the formation of the functional gate structures 140, transistors T10 are completed. Each of the transistors T10 may include a functional gate structure 140 serving as a gate terminal and its corresponding epitaxial features 120 serving as source/drain terminals.

Figure 23:
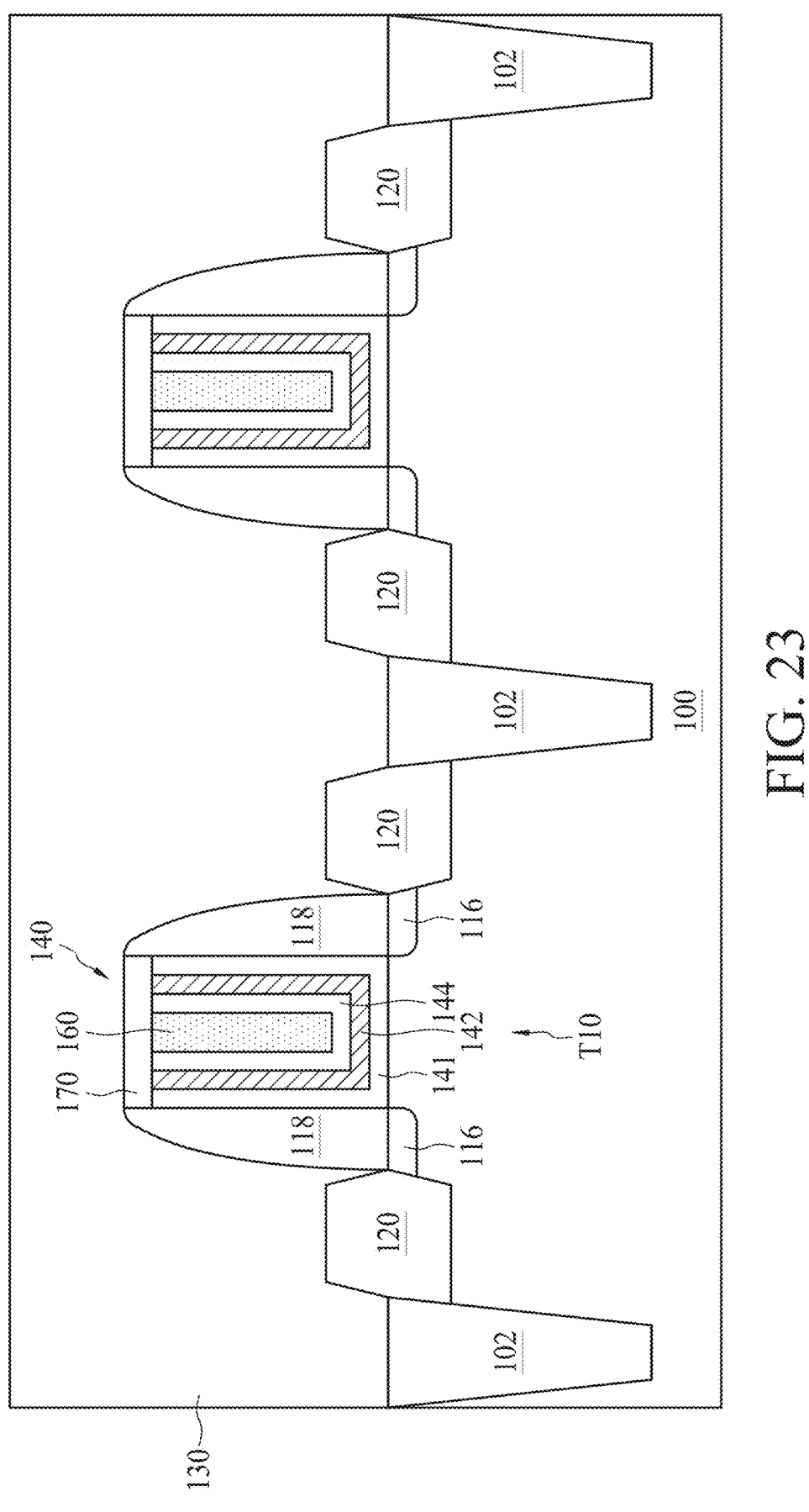
Figure 24:
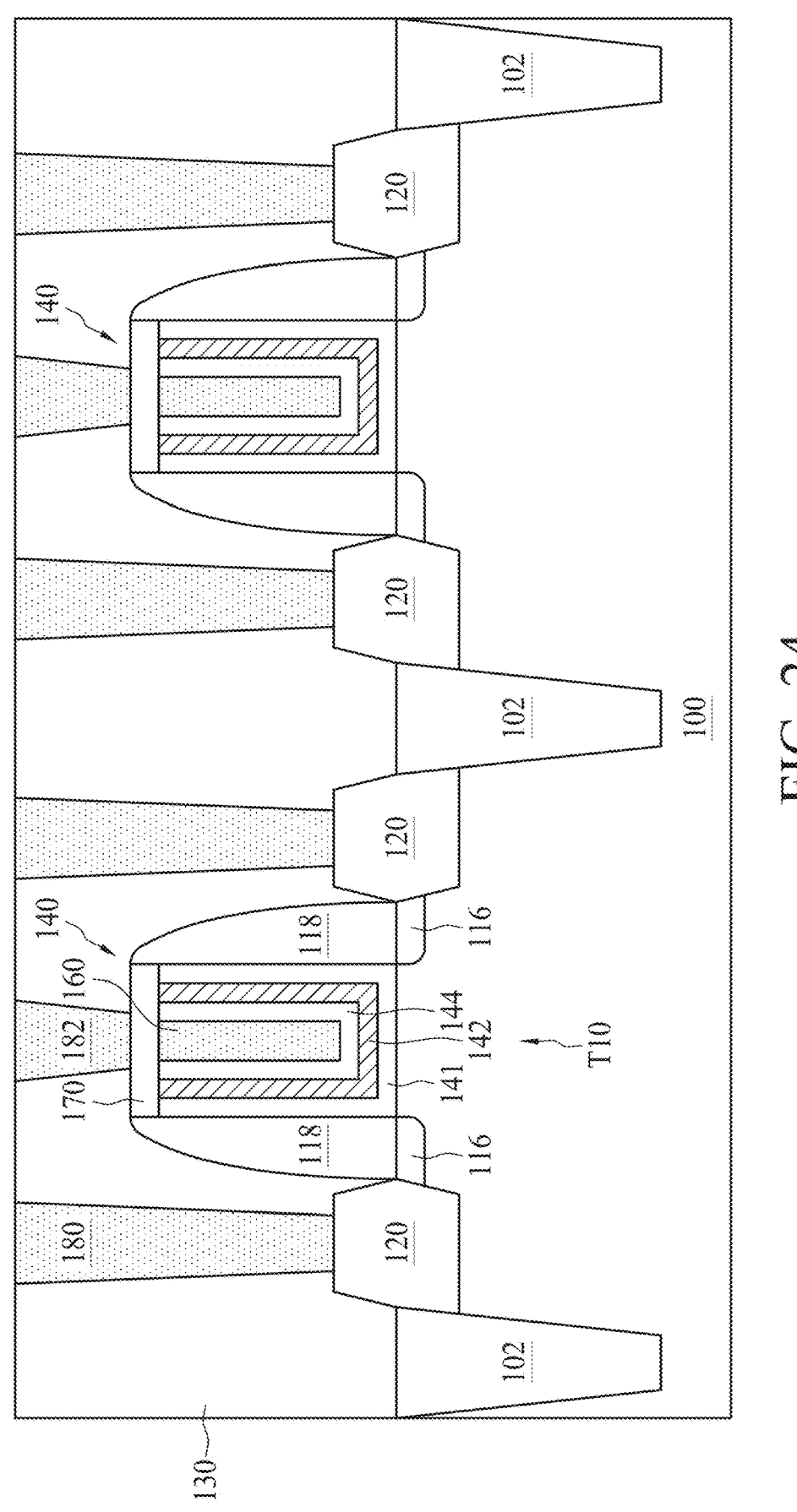

In operation 217 of FIG. 3, conductive contacts 180 and 182 are respectively formed over the epitaxial features 120 and the functional gate structures 140, as shown in FIGS. 23 and 24. Referring to FIG. 23, more ILD layers may be formed over the ILD layer 130 for subsequent operations, and thus the combined ILD layers are also referred to as the ILD layer 130 for simplicity.

Referring to FIG. 24, the conductive contact 180 is formed on the epitaxial feature 120, and the conductive contact 182 is formed on the functional gate structure 140. Although not illustrated, the conductive contacts 180 and 182 may be formed using a series of lithographic, etching, deposition and planarization operations. For example, multiple contact holes can be formed in the ILD layer 130 to respectively expose the epitaxial features 120 and the functional gate structures 140. Subsequently, one or more conductive materials, such as W, Cu, Co, Al, Ni, Ta, Ti, Mo, Pd, Pt, Ru, Ir, Ag, Au, the like, or a combination thereof, can be deposited into the contact holes using sputtering, electroplating, PVD or other suitable methods to form the conductive contacts 180 and 182. A CMP operation may be used to remove any excess conductive material over the top surface of the ILD layer 130. The conductive contacts 180 and 182 may be formed simultaneously or separately, and the order for forming the conductive contacts 180 and 182 is not limited. The conductive contact 180 may be electrically coupled to the epitaxial feature 120, and the conductive contact 182 may be electrically coupled to the functional gate structure 140. A diffusion barrier layer (not shown) may be disposed between each of the conductive contacts 180 and the ILD layer 130 and between each of the conductive contacts 182 and the ILD layer 130. The diffusion barrier layer may be formed of TiN, TaN, Ta, Ti, TiSN, TaSN, W, WN, or combinations thereof, using ALD, PVD or other suitable methods. The diffusion barrier layer may be used to prevent the conductive material of the conductive contacts 180 and 182 from diffusing into the ILD layer 130.

Figure 25:

In operation 219 of FIG. 3, an interconnect structure 190 is formed over the conductive contacts 180 and 182, as shown in FIG. 25. The interconnect structure 190 includes multiple higher-level conductive features such as conductive vias and conductive lines formed in the back-end-of-line (BEOL) stage. Although not illustrated, the interconnect structure 190 may be formed using a series of lithographic, etching, deposition and planarization operations. The conductive vias and the conductive lines may be formed using a single-damascene method or a dual-damascene method. The conductive vias and the conductive lines may be embedded in one or more dielectric layers. The conductive vias and the conductive lines may be electrically connected with each other. The interconnect structure 190 may be electrically coupled to the conductive contacts 180, 182, the epitaxial features 120 and the functional gate structures 140. At this stage, operations for forming the semiconductor device 10 have been completed.

During the formation of a gate structure, several operations are required and repeated, and some of these operations may include a vacuum relief. Oxygen gas in the fab may diffuse to oxidize metal features of the gate structure, causing the threshold voltage of a transistor including the gate structure to vary significantly. The present disclosure provides a method of preventing the work function layer of a gate structure from being oxidized. The method includes forming multiple barrier elements such as Al atoms and/or Si atoms on or in the work function layer. The barrier elements may be referred to as oxygen-trapping elements. The barrier elements can prevent oxygen gas from diffusing into the work function layer. Oxygen gas may be adsorbed or bonded on surfaces of the barrier elements instead of entering the interior portion of the work function layer. Subsequently, the adsorbed or bonded oxygen is removed using an ALE operation. A metal halide compound is used in the ALE operation. The method of the present disclosure is not limited to a semiconductor device formed using a "gate last" technique. The method can also be used to a semiconductor device formed using a "gate first" technique. In addition, the method is applicable to various semiconductor devices such as a planar device, a FinFET device, a gate-all-around (GAA) device, a nano-sheet device, a non-volatile memory (NVM) device, and the like.

One aspect of the present disclosure provides a method of manufacturing a semiconductor device. The method includes: forming a transistor region in a substrate; forming a gate dielectric layer over the transistor region; forming a diffusion-blocking layer over the gate dielectric layer; forming a first portion of a work function layer over the diffusion-blocking layer; forming a second portion of the work function layer over the first portion of the work function layer; forming a plurality of barrier elements on or under a top surface of the second portion of the work function layer; and forming a gate electrode over the work function layer, wherein the plurality of barrier elements block oxygen from diffusing into the work function layer during the formation of the gate electrode.

One aspect of the present disclosure provides another method of manufacturing a semiconductor device. The method includes: forming a transistor region in a substrate; forming a gate dielectric layer over the transistor region; forming a diffusion-blocking layer over the gate dielectric layer; forming a work function layer over the diffusion-blocking layer; depositing an oxygen-trapping element on or under a top surface of the work function layer; forming an oxide layer from the oxygen-trapping element trapping oxygen from an ambient environment; removing the oxide layer; and forming a gate electrode over the work function layer.

One aspect of the present disclosure provides another method of manufacturing a semiconductor device. The method includes: forming a transistor region in a substrate; forming a gate dielectric layer over the transistor region; forming a diffusion-blocking layer over the gate dielectric layer; forming a first portion of a work function layer over the diffusion-blocking layer; simultaneously forming a second portion of the work function layer and an oxygen-trapping element on a top surface of the first portion of the work function layer; forming an oxide layer from the oxygen-trapping element trapping oxygen from an ambient environment; removing the oxide layer by reacting the oxide layer with a metal halide compound; and forming a gate electrode over the second portion of the work function layer.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a transistor region in a substrate;
   forming a gate dielectric layer over the transistor region;
   forming a diffusion-blocking layer over the gate dielectric layer;
   forming a first portion of a work function layer over the diffusion-blocking layer;
   forming a second portion of the work function layer over the first portion of the work function layer;
   forming a plurality of barrier elements on or under a top surface of the second portion of the work function layer; and
   forming a gate electrode over the work function layer,
   wherein the plurality of barrier elements serve as oxygen-trapping elements for blocking oxygen from diffusing into the work function layer during the formation of the gate electrode, wherein
   the plurality of barrier elements are formed by fractionally and sequentially injecting a precursor compound of the oxygen-trapping element into an atomic layer deposition (ALD) chamber, and
   a duration of the precursor compound of the plurality of barrier elements injected into the ALD chamber is increased in an interval.

2. The method of claim 1, wherein before the formation of the plurality of barrier elements, further comprising purging argon (Ar) or nitrogen (N2) to remove by-products of the work function layer.

3. The method of claim 1, wherein the work function layer includes TaN, TiN, TiAlC, TaAlC, TiAl, TaAl, TiAlSi or TaAlSi.

4. The method of claim 1, wherein during the formation of the second portion of the work function layer, a precursor compound of the work function layer and the precursor compound of the plurality of barrier elements are sequentially and alternately injected into the ALD chamber.

5. The method of claim 1, wherein the precursor compound of the plurality of barrier elements includes triethylaluminium, trimethylaluminium or silane.

6. The method of claim 1, wherein before the formation of the plurality of barrier elements on or under the top surface of the second portion of the work function layer, an atomic layer etching (ALE) operation is used to remove an oxide layer formed by a partial oxidation of the second portion of the work function layer.

7. The method of claim 1, wherein a total duration of injecting the precursor compound of the plurality of barrier elements into the ALD chamber is between about 20 seconds(s) and 40 s.

8. The method of claim 1, wherein the plurality of barrier elements include aluminum (Al) atoms or silicon (Si) atoms.

9. The method of claim 8, wherein a distribution of the Al atoms or the Si atoms increases toward the top surface of the second portion of the work function layer.

10. A method of manufacturing a semiconductor device, comprising:

forming a transistor region in a substrate;

forming a gate dielectric layer over the transistor region;

forming a diffusion-blocking layer over the gate dielectric layer;

forming a work function layer over the diffusion-blocking layer;

depositing an oxygen-trapping element on or under a top surface of the work function layer;

forming an oxide layer from the oxygen-trapping element trapping oxygen from an ambient environment;

removing the oxide layer; and forming a gate electrode over the work function layer, wherein the oxygen-trapping element is formed by fractionally and sequentially injecting a precursor compound of the oxygen-trapping element into an ALD chamber, and a duration of the precursor compound of the oxygen-trapping element injected into the ALD chamber is increased in an interval.

11. The method of claim 10, wherein the oxygen-trapping element prevents the oxygen gas from diffusing into the work function layer.

12. The method of claim 10, wherein the oxide layer is removed by an atomic layer etching (ALE) operation.

13. The method of claim 12, wherein the oxide layer is reacted with a metal halide compound including tungsten chloride, molybdenum chloride or niobium chloride in the ALE operation.

14. The method of claim 10, before the deposition of the oxygen-trapping element, further comprising purging argon (Ar) or nitrogen (N2) to remove by-products of the work function layer.

15. The method of claim 10, wherein an affinity between oxygen-trapping element and oxygen is greater than an affinity between titanium (Ti) or tantalum (Ta) and oxygen.

16. A method of manufacturing a semiconductor device, comprising:

forming a transistor region in a substrate;

forming a gate dielectric layer over the transistor region;

forming a diffusion-blocking layer over the gate dielectric layer;

forming a first portion of a work function layer over the diffusion-blocking layer;

simultaneously forming a second portion of the work function layer and an oxygen-trapping element on a top surface of the first portion of the work function layer;

forming an oxide layer from the oxygen-trapping element trapping oxygen from an ambient environment;

removing the oxide layer by reacting the oxide layer with a metal halide compound; and forming a gate electrode over the second portion of the work function layer, wherein the oxygen-trapping element is formed by fractionally and sequentially injecting a precursor compound of the oxygen-trapping element into an ALD chamber, and a duration of the precursor compound of the oxygen-trapping element injected into the ALD chamber is increased in an interval.

17. The method of claim 16, wherein the oxygen-trapping element is doped into the second portion of the work function layer.

18. The method of claim 16, wherein after the reaction of the oxide layer with the metal halide, a metal ion of the metal halide is reduced to form a metal layer.

19. The method of claim 18, wherein the metal layer includes tungsten (W), molybdenum (Mo) or niobium (Nb).

20. The method of claim 18, wherein the metal layer is formed between the second portion of the work function layer and the gate electrode.

\* \* \* \* \*